(12) United States Patent
Dunn et al.

(10) Patent No.: US 12,035,486 B1
(45) Date of Patent: Jul. 9, 2024

(54) ELECTRONIC DISPLAY ASSEMBLY WITH FABRIC PANEL COMMUNICATIONS BOX

(71) Applicant: Manufacturing Resources International, Inc., Alpharetta, GA (US)

(72) Inventors: William Dunn, Alpharetta, GA (US); Mike Brown, Cumming, GA (US); Geoffrey Watson, Alpharetta, GA (US)

(73) Assignee: Manufacturing Resources International, Inc., Alpharetta, GA (US)

( * ) Notice: Subject to any disclaimer, the term of this patent is extended or adjusted under 35 U.S.C. 154(b) by 0 days.

(21) Appl. No.: 18/225,204

(22) Filed: Jul. 24, 2023

Related U.S. Application Data

(60) Provisional application No. 63/392,032, filed on Jul. 25, 2022.

(51) Int. Cl.
| | | |
|---|---|---|
| *H05K 5/00* | (2006.01) | |
| *G02F 1/1333* | (2006.01) | |
| *H05K 5/02* | (2006.01) | |
| *H05K 7/18* | (2006.01) | |
| *H05K 7/20* | (2006.01) | |

(52) U.S. Cl.
CPC ..... *H05K 5/0004* (2013.01); *G02F 1/133308* (2013.01); *H05K 5/0204* (2013.01); *H05K 5/0215* (2022.08); *H05K 5/0243* (2013.01); *H05K 5/0247* (2013.01); *H05K 7/186* (2013.01); *H05K 7/20172* (2013.01); *H05K 7/20954* (2013.01); *H05K 7/20972* (2013.01)

(58) Field of Classification Search
CPC .. H05K 5/0004; H05K 5/0204; H05K 5/0215; H05K 5/0243; H05K 5/0247; H05K 7/186; H05K 7/20172; H05K 7/20954; H05K 7/20972; G02F 1/133308
USPC .......................................................... 361/600
See application file for complete search history.

(56) References Cited

U.S. PATENT DOCUMENTS

| | | | |
|---|---|---|---|
| 4,093,355 A | 6/1978 | Kaplit et al. | |
| 4,292,370 A | 9/1981 | Pekko | |
| 4,327,803 A | 5/1982 | Muellejans et al. | |
| 4,488,193 A | 12/1984 | Davis et al. | |
| 4,593,978 A | 6/1986 | Mourey et al. | |
| 4,634,225 A | 1/1987 | Haim et al. | |

(Continued)

FOREIGN PATENT DOCUMENTS

| | | |
|---|---|---|
| AU | 2011248190 B2 | 5/2011 |
| AU | 2014287438 B2 | 1/2018 |

(Continued)

OTHER PUBLICATIONS

ITSENCLOSURES, Product Catalog, 2009, 48 pages.

(Continued)

*Primary Examiner* — Zhengfu J Feng
(74) *Attorney, Agent, or Firm* — Standley Law Group LLP; Jeffrey S. Standley; Adam J. Smith

(57) ABSTRACT

A display assembly includes a communications box and one or more electronic display subassemblies attached to a mounting structure. The communications box is located above the one or more electronic display subassemblies and has a front panel and a rear panel, at least one of which comprises fabric for ambient air to travel through to cool electronic equipment located within.

20 Claims, 11 Drawing Sheets

(56) References Cited

U.S. PATENT DOCUMENTS

| | | |
|---|---|---|
| 4,748,765 A | 6/1988 | Martin |
| 4,763,993 A | 8/1988 | Vogeley et al. |
| 4,921,041 A | 5/1990 | Akachi |
| 4,952,783 A | 8/1990 | Aufderheide et al. |
| 4,952,925 A | 8/1990 | Haastert |
| 4,976,536 A | 12/1990 | Vogeley et al. |
| 5,002,118 A | 3/1991 | Olmstead et al. |
| 5,029,982 A | 7/1991 | Nash |
| 5,088,806 A | 2/1992 | McCartney et al. |
| 5,132,666 A | 7/1992 | Fahs |
| 5,150,231 A | 9/1992 | Iwamoto et al. |
| 5,247,374 A | 9/1993 | Terada |
| 5,255,029 A | 10/1993 | Vogeley et al. |
| 5,282,114 A | 1/1994 | Stone |
| 5,285,677 A | 2/1994 | Oehler |
| 5,293,930 A | 3/1994 | Pitasi |
| 5,351,176 A | 9/1994 | Smith et al. |
| 5,432,526 A | 7/1995 | Hyatt |
| 5,535,816 A | 7/1996 | Ishida |
| 5,559,614 A | 9/1996 | Urbish et al. |
| 5,621,614 A | 4/1997 | O'Neill |
| 5,657,641 A | 8/1997 | Cunningham et al. |
| 5,748,269 A | 5/1998 | Harris et al. |
| 5,765,743 A | 6/1998 | Sakiura et al. |
| 5,767,489 A | 6/1998 | Ferrier |
| 5,808,418 A | 9/1998 | Pitman et al. |
| 5,818,010 A | 10/1998 | McCann |
| 5,818,694 A | 10/1998 | Daikoku et al. |
| 5,835,179 A | 11/1998 | Yamanaka |
| 5,864,465 A | 1/1999 | Liu |
| 5,869,818 A | 2/1999 | Kim |
| 5,869,919 A | 2/1999 | Sato et al. |
| 5,903,433 A | 5/1999 | Gudmundsson |
| 5,920,367 A | 7/1999 | Kajimoto et al. |
| 5,991,153 A | 11/1999 | Heady et al. |
| 6,003,015 A | 12/1999 | Kang et al. |
| 6,007,205 A | 12/1999 | Fujimori |
| 6,043,979 A | 3/2000 | Shim |
| 6,089,751 A | 7/2000 | Conover et al. |
| 6,104,451 A | 8/2000 | Matsuoka et al. |
| 6,125,565 A | 10/2000 | Hillstrom |
| 6,157,432 A | 12/2000 | Helbing |
| 6,181,070 B1 | 1/2001 | Dunn et al. |
| 6,191,839 B1 | 2/2001 | Briley et al. |
| 6,198,222 B1 | 3/2001 | Chang |
| 6,211,934 B1 | 4/2001 | Habing et al. |
| 6,215,655 B1 | 4/2001 | Heady et al. |
| 6,222,503 B1 | 4/2001 | Gietema et al. |
| 6,244,333 B1 | 6/2001 | Bergh et al. |
| 6,351,381 B1 | 2/2002 | Bilski et al. |
| 6,359,390 B1 | 3/2002 | Nagai |
| 6,392,727 B1 | 5/2002 | Larson et al. |
| 6,417,900 B1 | 7/2002 | Shin et al. |
| 6,428,198 B1 | 8/2002 | Saccomanno et al. |
| 6,437,673 B1 | 8/2002 | Nishida et al. |
| 6,473,150 B1 | 10/2002 | Takushima et al. |
| 6,476,883 B1 | 11/2002 | Salimes et al. |
| 6,493,440 B2 | 12/2002 | Gromatsky et al. |
| 6,504,713 B1 | 1/2003 | Pandolfi et al. |
| 6,535,266 B1 | 3/2003 | Nemeth et al. |
| 6,628,355 B1 | 9/2003 | Takahara |
| 6,643,130 B1 | 11/2003 | DeMarchis et al. |
| 6,683,639 B2 | 1/2004 | Driessen-Olde Scheper et al. |
| 6,701,143 B1 | 3/2004 | Dukach et al. |
| 6,714,410 B2 | 3/2004 | Wellhofer |
| 6,727,468 B1 | 4/2004 | Nemeth |
| 6,742,583 B2 | 6/2004 | Tikka |
| 6,812,851 B1 | 11/2004 | Dukach et al. |
| 6,825,828 B2 | 11/2004 | Burke et al. |
| 6,833,992 B2 | 12/2004 | Kusaka et al. |
| 6,839,104 B2 | 1/2005 | Taniguchi et al. |
| 6,850,209 B2 | 2/2005 | Mankins et al. |
| 6,885,412 B2 | 4/2005 | Ohnishi et al. |
| 6,886,942 B2 | 5/2005 | Okada et al. |
| 6,891,135 B2 | 5/2005 | Pala et al. |
| 6,909,486 B2 | 6/2005 | Wang et al. |
| 6,943,768 B2 | 9/2005 | Cavanaugh et al. |
| 6,961,108 B2 | 11/2005 | Wang et al. |
| 7,015,470 B2 | 3/2006 | Faytlin et al. |
| 7,059,757 B2 | 6/2006 | Shimizu |
| 7,083,285 B2 | 8/2006 | Hsu et al. |
| 7,157,838 B2 | 1/2007 | Thielemans et al. |
| 7,161,803 B1 | 1/2007 | Heady |
| 7,164,586 B2 | 1/2007 | Lin |
| 7,190,416 B2 | 3/2007 | Paukshto et al. |
| 7,190,587 B2 | 3/2007 | Kim et al. |
| 7,209,349 B2 | 4/2007 | Chien et al. |
| 7,212,403 B2 | 5/2007 | Rockenfell |
| 7,259,964 B2 | 8/2007 | Yamamura et al. |
| 7,269,023 B2 | 9/2007 | Nagano |
| 7,284,874 B2 | 10/2007 | Jeong et al. |
| 7,342,789 B2 | 3/2008 | Hall et al. |
| 7,396,145 B2 | 7/2008 | Wang et al. |
| 7,447,018 B2 | 11/2008 | Lee et al. |
| 7,452,121 B2 | 11/2008 | Cho et al. |
| 7,457,113 B2 | 11/2008 | Kumhyr et al. |
| 7,466,546 B2 | 12/2008 | Park |
| 7,480,140 B2 | 1/2009 | Hara et al. |
| 7,492,589 B2 | 2/2009 | Park |
| 7,518,864 B2 | 4/2009 | Kimura |
| 7,535,543 B2 | 5/2009 | Dewa et al. |
| 7,591,508 B2 | 9/2009 | Chang |
| 7,602,469 B2 | 10/2009 | Shin |
| D608,775 S | 1/2010 | Leung |
| 7,667,964 B2 | 2/2010 | Kang et al. |
| 7,682,047 B2 | 3/2010 | Hsu et al. |
| 7,752,858 B2 | 7/2010 | Johnson et al. |
| 7,753,567 B2 | 7/2010 | Kang et al. |
| 7,762,707 B2 | 7/2010 | Kim et al. |
| 7,800,706 B2 | 9/2010 | Kim et al. |
| 7,813,124 B2 | 10/2010 | Karppanen |
| 7,903,416 B2 | 3/2011 | Chou |
| 7,995,342 B2 | 8/2011 | Nakamichi et al. |
| 8,004,648 B2 | 8/2011 | Dunn |
| 8,035,968 B2 | 10/2011 | Kwon et al. |
| 8,081,267 B2 | 12/2011 | Moscovitch et al. |
| 8,081,465 B2 | 12/2011 | Nishiura |
| 8,102,173 B2 | 1/2012 | Merrow |
| 8,102,483 B2 | 1/2012 | Perry et al. |
| 8,142,027 B2 | 3/2012 | Sakai |
| 8,208,115 B2 | 6/2012 | Dunn |
| 8,223,311 B2 | 7/2012 | Kim et al. |
| 8,241,573 B2 | 8/2012 | Banerjee et al. |
| 8,248,784 B2 | 8/2012 | Nakamichi et al. |
| 8,254,121 B2 | 8/2012 | Lee et al. |
| 8,269,916 B2 | 9/2012 | Ohkawa |
| 8,270,163 B2 | 9/2012 | Nakamichi et al. |
| 8,274,622 B2 | 9/2012 | Dunn |
| 8,274,789 B2 | 9/2012 | Nakamichi et al. |
| 8,300,203 B2 | 10/2012 | Nakamichi et al. |
| 8,310,824 B2 | 11/2012 | Dunn et al. |
| 8,320,119 B2 | 11/2012 | Isoshima et al. |
| 8,351,014 B2 | 1/2013 | Dunn |
| 8,358,397 B2 | 1/2013 | Dunn |
| 8,369,083 B2 | 2/2013 | Dunn et al. |
| 8,373,841 B2 | 2/2013 | Dunn |
| 8,379,182 B2 | 2/2013 | Dunn |
| 8,400,608 B2 | 3/2013 | Takahashi et al. |
| 8,472,174 B2 | 6/2013 | Idems et al. |
| 8,472,191 B2 | 6/2013 | Yamamoto et al. |
| 8,482,695 B2 | 7/2013 | Dunn |
| 8,497,972 B2 | 7/2013 | Dunn et al. |
| 8,590,602 B2 | 11/2013 | Fernandez |
| 8,649,170 B2 | 2/2014 | Dunn et al. |
| 8,649,176 B2 | 2/2014 | Okada et al. |
| 8,654,302 B2 | 2/2014 | Dunn et al. |
| 8,678,603 B2 | 3/2014 | Zhang |
| 8,693,185 B2 | 4/2014 | Dunn et al. |
| 8,700,226 B2 | 4/2014 | Schuch et al. |
| 8,711,321 B2 | 4/2014 | Dunn et al. |
| 8,749,749 B2 | 6/2014 | Hubbard |
| 8,755,021 B2 | 6/2014 | Hubbard |
| 8,758,144 B2 | 6/2014 | Williams et al. |
| 8,760,613 B2 | 6/2014 | Dunn |

(56) References Cited

U.S. PATENT DOCUMENTS

| | | |
|---|---|---|
| 8,767,165 B2 | 7/2014 | Dunn |
| 8,773,633 B2 | 7/2014 | Dunn et al. |
| 8,804,091 B2 | 8/2014 | Dunn et al. |
| 8,823,916 B2 | 9/2014 | Hubbard et al. |
| 8,827,472 B2 | 9/2014 | Takada |
| 8,854,572 B2 | 10/2014 | Dunn |
| 8,854,595 B2 | 10/2014 | Dunn |
| 8,879,042 B2 | 11/2014 | Dunn |
| 8,976,313 B2 | 3/2015 | Kim et al. |
| 8,988,647 B2 | 3/2015 | Hubbard |
| 9,030,641 B2 | 5/2015 | Dunn |
| 9,089,079 B2 | 7/2015 | Dunn |
| 9,119,325 B2 | 8/2015 | Dunn et al. |
| 9,119,330 B2 | 8/2015 | Hubbard et al. |
| 9,173,322 B2 | 10/2015 | Dunn |
| 9,173,325 B2 | 10/2015 | Dunn |
| 9,282,676 B1 | 3/2016 | Diaz |
| 9,285,108 B2 | 3/2016 | Dunn et al. |
| 9,313,917 B2 | 4/2016 | Dunn et al. |
| 9,335,579 B2 | 5/2016 | Onoue |
| 9,338,923 B2 | 5/2016 | Lee et al. |
| 9,357,673 B2 | 5/2016 | Chin |
| 9,370,127 B2 | 6/2016 | Dunn |
| 9,414,516 B2 | 8/2016 | Chin et al. |
| 9,448,569 B2 | 9/2016 | Schuch et al. |
| 9,451,060 B1 | 9/2016 | Bowers et al. |
| 9,451,733 B2 | 9/2016 | Dunn et al. |
| 9,456,525 B2 | 9/2016 | Yoon et al. |
| 9,470,924 B2 | 10/2016 | Dunn et al. |
| 9,500,896 B2 | 11/2016 | Dunn et al. |
| 9,504,188 B1 | 11/2016 | Campbell et al. |
| 9,516,485 B1 | 12/2016 | Bowers et al. |
| 9,549,490 B2 | 1/2017 | Hubbard |
| 9,594,271 B2 | 3/2017 | Dunn et al. |
| 9,600,026 B2 | 3/2017 | Birgeoglu et al. |
| 9,613,548 B2 | 4/2017 | DeMars |
| 9,622,392 B1 | 4/2017 | Bowers et al. |
| 9,629,287 B2 | 4/2017 | Dunn |
| 9,648,790 B2 | 5/2017 | Dunn et al. |
| 9,655,289 B2 | 5/2017 | Dunn et al. |
| 9,698,477 B1 | 7/2017 | Jabara et al. |
| 9,703,230 B2 | 7/2017 | Bowers et al. |
| 9,723,765 B2 | 8/2017 | DeMars |
| 9,743,553 B2 | 8/2017 | Kim et al. |
| 9,756,739 B2 | 9/2017 | Russell-Clarke et al. |
| 9,797,588 B2 | 10/2017 | Dunn et al. |
| 9,801,305 B2 | 10/2017 | Dunn et al. |
| 9,823,690 B2 | 11/2017 | Bowers et al. |
| 9,835,893 B2 | 12/2017 | Dunn |
| 9,857,618 B2 | 1/2018 | Barnes |
| 9,861,007 B2 | 1/2018 | Yoon et al. |
| 9,894,800 B2 | 2/2018 | Dunn |
| 10,070,540 B2 | 9/2018 | Campagna et al. |
| 10,080,316 B2 | 9/2018 | Dunn et al. |
| 10,088,702 B2 | 10/2018 | Dunn et al. |
| 10,165,712 B1 | 12/2018 | Jang et al. |
| 10,180,591 B2 | 1/2019 | Lee et al. |
| 10,194,564 B2 | 1/2019 | Dunn et al. |
| 10,212,845 B2 | 2/2019 | Dunn et al. |
| 10,278,311 B2 | 4/2019 | DeMars |
| 10,278,312 B1 | 4/2019 | Davis et al. |
| 10,306,781 B2 | 5/2019 | Cho et al. |
| 10,314,212 B2 | 6/2019 | Hubbard |
| 10,359,659 B2 | 7/2019 | Dunn et al. |
| 10,359,817 B2 | 7/2019 | Yun et al. |
| 10,383,238 B2 | 8/2019 | Yun et al. |
| 10,398,066 B2 | 8/2019 | Dunn et al. |
| 10,405,456 B2 | 9/2019 | Jang et al. |
| 10,409,323 B2 | 9/2019 | Birgeoglu et al. |
| 10,420,257 B2 | 9/2019 | Dunn et al. |
| 10,485,113 B2 | 11/2019 | Dunn et al. |
| 10,485,147 B2 | 11/2019 | Oh et al. |
| 10,485,148 B2 | 11/2019 | Oh et al. |
| 10,488,896 B2 | 11/2019 | Simpson |
| 10,499,516 B2 | 12/2019 | Dunn et al. |
| 10,506,738 B2 | 12/2019 | Dunn |
| 10,506,740 B2 | 12/2019 | Dunn et al. |
| 10,524,384 B2 | 12/2019 | Dunn et al. |
| 10,524,397 B2 | 12/2019 | Dunn et al. |
| 10,548,247 B2 | 1/2020 | Demars |
| 10,624,218 B2 | 4/2020 | Dunn et al. |
| 10,660,245 B2 | 5/2020 | Dunn et al. |
| 10,687,446 B2 | 6/2020 | Dunn et al. |
| 10,716,224 B2 | 7/2020 | Dunn et al. |
| 10,720,698 B2 | 7/2020 | Larson et al. |
| 10,721,836 B2 | 7/2020 | Dunn et al. |
| 10,736,245 B2 | 8/2020 | Dunn et al. |
| 10,747,261 B2 | 8/2020 | Birgeoglu et al. |
| 10,754,184 B2 | 8/2020 | Wang et al. |
| 10,757,844 B2 | 8/2020 | Dunn et al. |
| 10,795,413 B1 | 10/2020 | Dunn |
| 10,820,445 B2 | 10/2020 | Diaz |
| 10,827,656 B2 | 11/2020 | Hubbard |
| 10,827,657 B2 | 11/2020 | Lee |
| 10,905,035 B2 | 1/2021 | Whitehead et al. |
| 10,925,174 B2 | 2/2021 | Dunn et al. |
| 10,969,615 B2 | 4/2021 | Wang et al. |
| 10,973,156 B2 | 4/2021 | Dunn et al. |
| 11,013,142 B2 | 5/2021 | Dunn et al. |
| 11,016,547 B2 | 5/2021 | Whitehead et al. |
| 11,019,735 B2 | 5/2021 | Dunn |
| 11,032,923 B2 | 6/2021 | Dunn et al. |
| 11,096,317 B2 | 8/2021 | Dunn |
| 11,191,193 B2 | 11/2021 | Hubbard |
| 11,251,520 B2 | 2/2022 | Schwartz |
| 11,470,749 B2 | 10/2022 | Dunn et al. |
| 11,477,923 B2 | 10/2022 | Brown |
| 11,507,141 B2 | 11/2022 | Dunn |
| 11,540,418 B2 | 12/2022 | Dunn et al. |
| 11,596,081 B2 | 2/2023 | Dunn et al. |
| 11,617,287 B2 | 3/2023 | Dunn |
| 2001/0001459 A1 | 5/2001 | Savant et al. |
| 2001/0019454 A1 | 9/2001 | Tadic-Galeb et al. |
| 2001/0023914 A1 | 9/2001 | Oddsen, Jr. |
| 2001/0032404 A1 | 10/2001 | Hillstrom |
| 2002/0009978 A1 | 1/2002 | Dukach et al. |
| 2002/0033919 A1 | 3/2002 | Sanelle et al. |
| 2002/0050793 A1 | 5/2002 | Cull et al. |
| 2002/0065046 A1 | 5/2002 | Mankins et al. |
| 2002/0084891 A1 | 7/2002 | Mankins et al. |
| 2002/0101553 A1 | 8/2002 | Enomoto et al. |
| 2002/0112026 A1 | 8/2002 | Fridman et al. |
| 2002/0122134 A1 | 9/2002 | Kalua |
| 2002/0126248 A1 | 9/2002 | Yoshida |
| 2002/0148600 A1 | 10/2002 | Bosch et al. |
| 2002/0149714 A1 | 10/2002 | Anderson et al. |
| 2002/0154255 A1 | 10/2002 | Gromatzky et al. |
| 2002/0164944 A1 | 11/2002 | Haglid |
| 2002/0164962 A1 | 11/2002 | Mankins et al. |
| 2002/0167637 A1 | 11/2002 | Burke et al. |
| 2003/0007109 A1 | 1/2003 | Park |
| 2003/0020884 A1 | 1/2003 | Okada et al. |
| 2003/0043091 A1 | 3/2003 | Takeuchi et al. |
| 2003/0104210 A1 | 6/2003 | Azumi et al. |
| 2003/0128511 A1 | 7/2003 | Nagashima et al. |
| 2003/0214785 A1 | 11/2003 | Perazzo |
| 2004/0012722 A1 | 1/2004 | Alvarez |
| 2004/0035032 A1 | 2/2004 | Milliken |
| 2004/0035558 A1 | 2/2004 | Todd et al. |
| 2004/0036622 A1 | 2/2004 | Dukach et al. |
| 2004/0036834 A1 | 2/2004 | Ohnishi et al. |
| 2004/0042174 A1 | 3/2004 | Tomioka et al. |
| 2004/0103570 A1 | 6/2004 | Ruttenberg |
| 2004/0105159 A1 | 6/2004 | Saccomanno et al. |
| 2004/0135482 A1 | 7/2004 | Thielemans et al. |
| 2004/0165139 A1 | 8/2004 | Anderson et al. |
| 2004/0207981 A1 | 10/2004 | Gorenz, Jr. et al. |
| 2004/0223299 A1 | 11/2004 | Ghosh |
| 2005/0012039 A1 | 1/2005 | Faytlin et al. |
| 2005/0012722 A1 | 1/2005 | Chon |
| 2005/0062373 A1 | 3/2005 | Kim et al. |
| 2005/0073632 A1 | 4/2005 | Dunn et al. |
| 2005/0073639 A1 | 4/2005 | Pan |
| 2005/0127796 A1 | 6/2005 | Olesen et al. |

(56) References Cited

U.S. PATENT DOCUMENTS

| | | |
|---|---|---|
| 2005/0134525 A1 | 6/2005 | Tanghe et al. |
| 2005/0134526 A1 | 6/2005 | Willem et al. |
| 2005/0213950 A1 | 9/2005 | Yoshimura |
| 2005/0219841 A1 | 10/2005 | Ikeda et al. |
| 2005/0229630 A1 | 10/2005 | Richter et al. |
| 2005/0237714 A1 | 10/2005 | Ebermann |
| 2005/0253699 A1 | 11/2005 | Madonia |
| 2005/0276053 A1 | 12/2005 | Nortrup et al. |
| 2005/0286131 A1 | 12/2005 | Saxena et al. |
| 2006/0012958 A1 | 1/2006 | Tomioka et al. |
| 2006/0012985 A1 | 1/2006 | Archie et al. |
| 2006/0018093 A1 | 1/2006 | Lai et al. |
| 2006/0034051 A1 | 2/2006 | Wang et al. |
| 2006/0056994 A1 | 3/2006 | Van Lear et al. |
| 2006/0077636 A1 | 4/2006 | Kim |
| 2006/0081367 A1 | 4/2006 | Chiu et al. |
| 2006/0082271 A1 | 4/2006 | Lee et al. |
| 2006/0092348 A1 | 5/2006 | Park |
| 2006/0125998 A1 | 6/2006 | Dewa et al. |
| 2006/0132699 A1 | 6/2006 | Cho et al. |
| 2006/0177587 A1 | 8/2006 | Ishizuka et al. |
| 2006/0199514 A1 | 9/2006 | Kimura |
| 2006/0209266 A1 | 9/2006 | Utsunomiya |
| 2006/0260790 A1 | 11/2006 | Theno et al. |
| 2006/0262079 A1 | 11/2006 | Seong et al. |
| 2006/0266499 A1 | 11/2006 | Choi et al. |
| 2006/0268194 A1 | 11/2006 | Morimoto et al. |
| 2006/0269216 A1 | 11/2006 | Wiemeyer et al. |
| 2006/0283579 A1 | 12/2006 | Ghosh et al. |
| 2007/0013647 A1 | 1/2007 | Lee et al. |
| 2007/0019419 A1 | 1/2007 | Hafuka et al. |
| 2007/0030879 A1 | 2/2007 | Hatta |
| 2007/0046874 A1 | 3/2007 | Adachi et al. |
| 2007/0047239 A1 | 3/2007 | Kang et al. |
| 2007/0065091 A1 | 3/2007 | Hinata et al. |
| 2007/0076431 A1 | 4/2007 | Atarashi et al. |
| 2007/0081344 A1 | 4/2007 | Cappaert et al. |
| 2007/0103863 A1 | 5/2007 | Kim |
| 2007/0103866 A1 | 5/2007 | Park |
| 2007/0115686 A1 | 5/2007 | Tyberghien |
| 2007/0139929 A1 | 6/2007 | Yoo et al. |
| 2007/0140671 A1 | 6/2007 | Yoshimura |
| 2007/0144704 A1 | 6/2007 | Bundza et al. |
| 2007/0151274 A1 | 7/2007 | Roche et al. |
| 2007/0151664 A1 | 7/2007 | Shin |
| 2007/0171353 A1 | 7/2007 | Hong |
| 2007/0176885 A1 | 8/2007 | Jun |
| 2007/0206158 A1 | 9/2007 | Kinoshita et al. |
| 2007/0211205 A1 | 9/2007 | Shibata |
| 2007/0212211 A1 | 9/2007 | Chiyoda et al. |
| 2007/0217221 A1 | 9/2007 | Lee et al. |
| 2007/0237636 A1 | 10/2007 | Hsu |
| 2007/0267174 A1 | 11/2007 | Kim |
| 2008/0035315 A1 | 2/2008 | Han |
| 2008/0054144 A1 | 3/2008 | Wohlford |
| 2008/0055534 A1 | 3/2008 | Kawano |
| 2008/0076342 A1 | 3/2008 | Bryant et al. |
| 2008/0083527 A1 | 4/2008 | Horng et al. |
| 2008/0099193 A1 | 5/2008 | Aksamit et al. |
| 2008/0148609 A1 | 6/2008 | Ogoreve |
| 2008/0165496 A1 | 7/2008 | Kang et al. |
| 2008/0209934 A1 | 9/2008 | Richards |
| 2008/0218446 A1 | 9/2008 | Yamanaka |
| 2008/0236005 A1 | 10/2008 | Isayev et al. |
| 2008/0267790 A1 | 10/2008 | Gaudet et al. |
| 2008/0283234 A1 | 11/2008 | Sagi et al. |
| 2008/0285290 A1 | 11/2008 | Ohashi et al. |
| 2008/0296134 A1 | 12/2008 | Hattori et al. |
| 2008/0310116 A1 | 12/2008 | O'Connor |
| 2008/0310158 A1 | 12/2008 | Harbers et al. |
| 2009/0009047 A1 | 1/2009 | Yanagawa et al. |
| 2009/0009729 A1 | 1/2009 | Sakai |
| 2009/0021461 A1 | 1/2009 | Hu et al. |
| 2009/0034188 A1 | 2/2009 | Sween et al. |
| 2009/0059518 A1 | 3/2009 | Kakikawa et al. |
| 2009/0065007 A1 | 3/2009 | Wilkinson et al. |
| 2009/0086430 A1 | 4/2009 | Kang et al. |
| 2009/0095819 A1 | 4/2009 | Brown et al. |
| 2009/0104989 A1 | 4/2009 | Williams et al. |
| 2009/0120629 A1 | 5/2009 | Ashe |
| 2009/0122218 A1 | 5/2009 | Oh et al. |
| 2009/0126906 A1 | 5/2009 | Dunn |
| 2009/0126907 A1 | 5/2009 | Dunn |
| 2009/0126914 A1 | 5/2009 | Dunn |
| 2009/0129021 A1 | 5/2009 | Dunn |
| 2009/0135365 A1 | 5/2009 | Dunn |
| 2009/0145581 A1 | 6/2009 | Hoffman et al. |
| 2009/0147170 A1 | 6/2009 | Oh et al. |
| 2009/0154096 A1 | 6/2009 | Iyengar et al. |
| 2009/0174626 A1 | 7/2009 | Isoshima et al. |
| 2009/0231807 A1 | 9/2009 | Bouissier |
| 2009/0241437 A1 | 10/2009 | Steinle et al. |
| 2009/0244472 A1 | 10/2009 | Dunn |
| 2009/0266507 A1 | 10/2009 | Turnbull et al. |
| 2009/0279240 A1 | 11/2009 | Karppanen |
| 2009/0302727 A1 | 12/2009 | Vincent et al. |
| 2009/0306820 A1 | 12/2009 | Simmons et al. |
| 2009/0323275 A1 | 12/2009 | Rehmann et al. |
| 2010/0060861 A1 | 3/2010 | Medin |
| 2010/0079949 A1 | 4/2010 | Nakamichi et al. |
| 2010/0079979 A1 | 4/2010 | Nakamichi et al. |
| 2010/0162747 A1 | 7/2010 | Hamel et al. |
| 2010/0171889 A1 | 7/2010 | Pantel et al. |
| 2010/0182562 A1 | 7/2010 | Yoshida et al. |
| 2010/0220249 A1 | 9/2010 | Nakamichi et al. |
| 2010/0226091 A1 | 9/2010 | Dunn |
| 2010/0232107 A1 | 9/2010 | Dunn |
| 2010/0238394 A1 | 9/2010 | Dunn |
| 2010/0315570 A1* | 12/2010 | Mathew ............. G06F 1/1637 |
| | | 257/E27.111 |
| 2010/0321887 A1 | 12/2010 | Kwon et al. |
| 2011/0001898 A1 | 1/2011 | Mikubo et al. |
| 2011/0013114 A1 | 1/2011 | Dunn et al. |
| 2011/0019363 A1 | 1/2011 | Vahlsing et al. |
| 2011/0032489 A1 | 2/2011 | Kimoto et al. |
| 2011/0051071 A1 | 3/2011 | Nakamichi et al. |
| 2011/0051369 A1 | 3/2011 | Takahara |
| 2011/0058326 A1 | 3/2011 | Idems et al. |
| 2011/0072697 A1 | 3/2011 | Miller |
| 2011/0075361 A1 | 3/2011 | Nakamichi et al. |
| 2011/0083460 A1 | 4/2011 | Thomas et al. |
| 2011/0083824 A1 | 4/2011 | Rogers |
| 2011/0085301 A1* | 4/2011 | Dunn ............... H05K 7/20972 |
| | | 361/695 |
| 2011/0085302 A1 | 4/2011 | Nakamichi et al. |
| 2011/0114384 A1 | 5/2011 | Sakamoto et al. |
| 2011/0116000 A1 | 5/2011 | Dunn et al. |
| 2011/0116231 A1 | 5/2011 | Dunn et al. |
| 2011/0122162 A1 | 5/2011 | Sato et al. |
| 2011/0134356 A1 | 6/2011 | Swatt et al. |
| 2011/0141672 A1 | 6/2011 | Farley, Jr. et al. |
| 2011/0141724 A1 | 6/2011 | Erion |
| 2011/0162831 A1 | 7/2011 | Lee et al. |
| 2011/0167845 A1 | 7/2011 | Lee et al. |
| 2011/0261523 A1 | 10/2011 | Dunn et al. |
| 2011/0297810 A1 | 12/2011 | Tachibana |
| 2012/0006523 A1 | 1/2012 | Masahiro et al. |
| 2012/0012295 A1 | 1/2012 | Kakiuchi et al. |
| 2012/0012300 A1 | 1/2012 | Dunn et al. |
| 2012/0014063 A1 | 1/2012 | Weiss |
| 2012/0020114 A1 | 1/2012 | Miyamoto et al. |
| 2012/0038849 A1 | 2/2012 | Dunn et al. |
| 2012/0044217 A1 | 2/2012 | Okada et al. |
| 2012/0105790 A1 | 5/2012 | Hubbard |
| 2012/0106081 A1 | 5/2012 | Hubbard et al. |
| 2012/0131936 A1 | 5/2012 | Yoshida et al. |
| 2012/0188481 A1 | 7/2012 | Kang et al. |
| 2012/0206687 A1 | 8/2012 | Dunn et al. |
| 2012/0223877 A1 | 9/2012 | Cho |
| 2012/0224116 A1* | 9/2012 | Barnes ................ G09F 13/04 |
| | | 362/370 |
| 2012/0236499 A1 | 9/2012 | Murayama et al. |
| 2012/0249402 A1 | 10/2012 | Kang |
| 2012/0255704 A1 | 10/2012 | Nakamichi |

(56) References Cited

U.S. PATENT DOCUMENTS

| | | |
|---|---|---|
| 2012/0274876 A1 | 11/2012 | Cappaert et al. |
| 2012/0284547 A1 | 11/2012 | Culbert et al. |
| 2012/0327600 A1 | 12/2012 | Dunn |
| 2013/0170140 A1 | 7/2013 | Dunn |
| 2013/0173358 A1 | 7/2013 | Pinkus |
| 2013/0176517 A1 | 7/2013 | Kim et al. |
| 2013/0201685 A1 | 8/2013 | Messmore et al. |
| 2013/0258659 A1 | 10/2013 | Erion |
| 2013/0279154 A1 | 10/2013 | Dunn |
| 2013/0294039 A1 | 11/2013 | Chao |
| 2013/0344794 A1 | 12/2013 | Shaw et al. |
| 2014/0044147 A1 | 2/2014 | Wyatt et al. |
| 2014/0085564 A1 | 3/2014 | Hendren et al. |
| 2014/0111758 A1 | 4/2014 | Dunn et al. |
| 2014/0113540 A1 | 4/2014 | Dunn et al. |
| 2014/0134767 A1 | 5/2014 | Ishida et al. |
| 2014/0184980 A1 | 7/2014 | Onoue |
| 2014/0190240 A1 | 7/2014 | He et al. |
| 2014/0268657 A1 | 9/2014 | Dunn et al. |
| 2014/0313452 A1 | 10/2014 | Dunn et al. |
| 2014/0313666 A1 | 10/2014 | Chin |
| 2014/0313698 A1 | 10/2014 | Dunn et al. |
| 2014/0314395 A1 | 10/2014 | Dunn et al. |
| 2014/0334100 A1 | 11/2014 | Yoon et al. |
| 2014/0361138 A1 | 12/2014 | Ramirez et al. |
| 2015/0009625 A1 | 1/2015 | Chin et al. |
| 2015/0009627 A1* | 1/2015 | Dunn ............... G02F 1/133382 361/695 |
| 2015/0087404 A1 | 3/2015 | Lesley et al. |
| 2015/0192371 A1 | 7/2015 | Hancock |
| 2015/0253611 A1 | 9/2015 | Yang et al. |
| 2015/0264826 A1 | 9/2015 | Dunn et al. |
| 2015/0319882 A1 | 11/2015 | Dunn et al. |
| 2015/0366101 A1 | 12/2015 | Dunn et al. |
| 2015/0371571 A1* | 12/2015 | Häger ............... G09F 9/33 348/552 |
| 2016/0041423 A1 | 2/2016 | Dunn |
| 2016/0044829 A1 | 2/2016 | Dunn |
| 2016/0162297 A1 | 6/2016 | Shao |
| 2016/0192536 A1 | 6/2016 | Diaz |
| 2016/0195254 A1 | 7/2016 | Dunn et al. |
| 2016/0198588 A1 | 7/2016 | DeMars |
| 2016/0238876 A1 | 8/2016 | Dunn et al. |
| 2016/0242329 A1 | 8/2016 | DeMars |
| 2016/0242330 A1 | 8/2016 | Dunn |
| 2016/0249493 A1 | 8/2016 | Dunn et al. |
| 2016/0265759 A1 | 9/2016 | Na et al. |
| 2016/0302331 A1 | 10/2016 | Dunn |
| 2017/0023823 A1 | 1/2017 | Dunn et al. |
| 2017/0068042 A1 | 3/2017 | Dunn et al. |
| 2017/0074453 A1 | 3/2017 | Bowers et al. |
| 2017/0083043 A1 | 3/2017 | Bowers et al. |
| 2017/0083062 A1 | 3/2017 | Bowers et al. |
| 2017/0111486 A1 | 4/2017 | Bowers et al. |
| 2017/0111520 A1 | 4/2017 | Bowers et al. |
| 2017/0111521 A1 | 4/2017 | Bowers et al. |
| 2017/0122546 A1 | 5/2017 | Abbott et al. |
| 2017/0127579 A1 | 5/2017 | Hubbard |
| 2017/0140344 A1 | 5/2017 | Bowers et al. |
| 2017/0147992 A1 | 5/2017 | Bowers et al. |
| 2017/0163519 A1 | 6/2017 | Bowers et al. |
| 2017/0172016 A1 | 6/2017 | Kang |
| 2017/0175411 A1 | 6/2017 | Bowers et al. |
| 2017/0188490 A1 | 6/2017 | Dunn et al. |
| 2017/0231112 A1 | 8/2017 | Dunn et al. |
| 2017/0245400 A1 | 8/2017 | Dunn et al. |
| 2017/0257978 A1 | 9/2017 | Diaz |
| 2017/0332523 A1 | 11/2017 | DeMars |
| 2017/0345346 A1 | 11/2017 | Hong et al. |
| 2018/0020579 A1 | 1/2018 | Chang et al. |
| 2018/0042134 A1 | 2/2018 | Dunn et al. |
| 2018/0088368 A1 | 3/2018 | Notoshi et al. |
| 2018/0088398 A1 | 3/2018 | Lee et al. |
| 2018/0116073 A1 | 4/2018 | Dunn |
| 2018/0199450 A1 | 7/2018 | Kim et al. |
| 2018/0259806 A1 | 9/2018 | Oh et al. |
| 2018/0263142 A1 | 9/2018 | Oh et al. |
| 2018/0310439 A1 | 10/2018 | Oh et al. |
| 2018/0314103 A1 | 11/2018 | Dunn et al. |
| 2018/0315356 A1 | 11/2018 | Dunn et al. |
| 2018/0317330 A1 | 11/2018 | Dunn et al. |
| 2018/0317350 A1 | 11/2018 | Dunn et al. |
| 2018/0364519 A1 | 12/2018 | Dunn et al. |
| 2019/0021189 A1 | 1/2019 | Kim et al. |
| 2019/0037738 A1 | 1/2019 | Dunn et al. |
| 2019/0089176 A1 | 3/2019 | Dunn et al. |
| 2019/0133002 A1 | 5/2019 | Dunn et al. |
| 2019/0159363 A1 | 5/2019 | Jang et al. |
| 2019/0208674 A1 | 7/2019 | Demars |
| 2019/0239365 A1 | 8/2019 | Dunn et al. |
| 2019/0289754 A1 | 9/2019 | Hubbard |
| 2019/0327865 A1 | 10/2019 | Dunn et al. |
| 2020/0096797 A1 | 3/2020 | Teragawa |
| 2020/0154597 A1 | 5/2020 | Dunn et al. |
| 2020/0163235 A1* | 5/2020 | Dunn ................... G09F 9/30 |
| 2020/0201402 A1 | 6/2020 | Lee et al. |
| 2020/0205303 A1 | 6/2020 | Dunn et al. |
| 2020/0253095 A1 | 8/2020 | Dunn et al. |
| 2020/0275585 A1 | 8/2020 | Dunn |
| 2020/0288585 A1 | 9/2020 | Dunn et al. |
| 2020/0319676 A1 | 10/2020 | Dunn |
| 2020/0352049 A1 | 11/2020 | Dunn et al. |
| 2020/0365975 A1 | 11/2020 | Hendrix et al. |
| 2020/0367391 A1 | 11/2020 | Dunn |
| 2020/0369169 A1 | 11/2020 | Mercer et al. |
| 2020/0387194 A1 | 12/2020 | Dunn |
| 2020/0390009 A1 | 12/2020 | Whitehead et al. |
| 2021/0007241 A1 | 1/2021 | Diaz |
| 2021/0022273 A1 | 1/2021 | Hubbard |
| 2021/0165472 A1 | 6/2021 | Chin |
| 2021/0168949 A1 | 6/2021 | Dunn et al. |
| 2021/0231998 A1 | 7/2021 | Noso et al. |
| 2021/0243906 A1 | 8/2021 | Dunn |
| 2021/0243914 A1 | 8/2021 | Dunn |
| 2021/0304644 A1 | 9/2021 | Webster |
| 2021/0307214 A1 | 9/2021 | Zhang et al. |
| 2021/0345528 A1 | 11/2021 | Dunn |
| 2021/0367331 A1 | 11/2021 | Lalos et al. |
| 2021/0408676 A1* | 12/2021 | Sainz Fuertes ...... H01Q 1/1242 |
| 2022/0035198 A1 | 2/2022 | Dunn et al. |
| 2022/0110227 A1 | 4/2022 | Brown |
| 2022/0121255 A1 | 4/2022 | Wang et al. |
| 2022/0132707 A1 | 4/2022 | Dunn et al. |
| 2022/0287200 A1 | 9/2022 | Dunn et al. |
| 2022/0394861 A1 | 12/2022 | Dunn et al. |
| 2022/0408616 A1 | 12/2022 | Brown |
| 2022/0408617 A1 | 12/2022 | Brown |
| 2023/0030742 A1 | 2/2023 | Dunn et al. |
| 2023/0032626 A1 | 2/2023 | Brown |
| 2023/0033017 A1 | 2/2023 | Dunn |
| 2023/0036767 A1 | 2/2023 | Dunn et al. |
| 2023/0056061 A1 | 2/2023 | Dunn et al. |
| 2023/0059819 A1 | 2/2023 | Dunn et al. |
| 2023/0164964 A1 | 5/2023 | Dunn et al. |
| 2023/0200031 A1 | 6/2023 | Dunn |
| 2023/0209786 A1 | 6/2023 | Dunn |

FOREIGN PATENT DOCUMENTS

| | | |
|---|---|---|
| AU | 2015253128 B2 | 3/2018 |
| AU | 2017216500 B2 | 10/2018 |
| AU | 2017216500 B2 | 1/2019 |
| AU | 2015229457 B2 | 3/2019 |
| AU | 2016220308 B2 | 3/2019 |
| AU | 2017228430 B2 | 3/2020 |
| AU | 2018258497 B2 | 1/2021 |
| AU | 2018257648 B2 | 2/2021 |
| BR | PI0820231-1 | 2/2019 |
| CA | 2705814 C | 2/2018 |
| CA | 2947524 C | 4/2018 |
| CA | 2915261 C | 8/2018 |
| CA | 2798277 C | 6/2019 |
| CA | 2809019 C | 9/2019 |
| CA | 2888494 C | 9/2019 |

(56) References Cited

FOREIGN PATENT DOCUMENTS

| | | |
|---|---|---|
| CA | 2976116 C | 11/2020 |
| CA | 3015365 C | 8/2021 |
| CA | 3059972 C | 1/2022 |
| CA | 2942321 C | 6/2022 |
| CA | 3059928 C | 11/2022 |
| CN | 2702363 Y | 5/2005 |
| CN | 201228893 Y | 4/2009 |
| CN | 202838830 U | 3/2013 |
| CN | 106304788 A | 1/2017 |
| CN | 107251671 A | 10/2017 |
| CN | 108700739 A | 10/2018 |
| CN | 107251671 B | 8/2019 |
| CN | 216697703 U * | 6/2022 |
| EP | 1408476 A1 | 4/2004 |
| EP | 1647766 A2 | 4/2006 |
| EP | 1722559 A1 | 11/2006 |
| EP | 1762892 A1 | 3/2007 |
| EP | 1951020 A1 | 7/2008 |
| EP | 2225603 A2 | 9/2010 |
| EP | 2370987 A2 | 10/2011 |
| EP | 2603831 A2 | 6/2013 |
| EP | 2801888 A2 | 11/2014 |
| EP | 2909829 A1 | 8/2015 |
| EP | 3020260 A2 | 5/2016 |
| EP | 3040766 A1 | 7/2016 |
| EP | 3117693 A2 | 1/2017 |
| EP | 3259968 A1 | 12/2017 |
| EP | 3423886 | 1/2019 |
| EP | 3468321 A1 | 4/2019 |
| EP | 3138372 B1 | 5/2019 |
| EP | 3117693 B1 | 8/2019 |
| EP | 2567283 B1 | 10/2019 |
| EP | 2909829 B1 | 2/2020 |
| EP | 3615978 A1 | 3/2020 |
| EP | 3616481 A1 | 3/2020 |
| EP | 3624574 A1 | 3/2020 |
| EP | 3468321 B1 | 4/2021 |
| EP | 3423886 B1 | 2/2022 |
| EP | 3259968 B1 | 4/2022 |
| GB | 2402205 A | 12/2004 |
| JP | 402062015 A | 3/1990 |
| JP | 402307080 A | 12/1990 |
| JP | 3153212 A | 7/1991 |
| JP | H06-2337 U | 1/1994 |
| JP | 6082745 A | 3/1994 |
| JP | H8-54834 A | 2/1996 |
| JP | H8-55567 A | 2/1996 |
| JP | 8115788 A | 5/1996 |
| JP | H8-152604 A | 6/1996 |
| JP | 8194437 A | 7/1996 |
| JP | H08-305301 A | 11/1996 |
| JP | 8339034 A | 12/1996 |
| JP | H9-160512 A | 6/1997 |
| JP | H09246766 A | 9/1997 |
| JP | H11-68363 A | 3/1999 |
| JP | 11160727 A | 6/1999 |
| JP | H11296094 A | 10/1999 |
| JP | 2000-10501 A | 1/2000 |
| JP | 2000131682 A | 5/2000 |
| JP | 3118907 B2 | 10/2000 |
| JP | 2001209126 A | 8/2001 |
| JP | 2002-6282 A | 1/2002 |
| JP | 2002158475 A | 5/2002 |
| JP | 2003-76286 A | 3/2003 |
| JP | 2003-162228 A | 6/2003 |
| JP | 2004053749 A | 2/2004 |
| JP | 2004-199675 A | 7/2004 |
| JP | 2004286940 A | 10/2004 |
| JP | 2005017556 A | 1/2005 |
| JP | 2005134849 A | 5/2005 |
| JP | 2005265922 A | 9/2005 |
| JP | 2006-32890 A | 2/2006 |
| JP | 2006513577 A | 4/2006 |
| JP | 2006148047 A | 6/2006 |
| JP | 2006163217 A | 6/2006 |
| JP | 2006-176112 A | 7/2006 |
| JP | 2006-330196 A | 12/2006 |
| JP | 2007003638 A | 1/2007 |
| JP | 2007-293105 A | 11/2007 |
| JP | 09307257 A | 11/2007 |
| JP | 2007322718 A | 12/2007 |
| JP | 2008010361 A | 1/2008 |
| JP | 2008292743 A | 12/2008 |
| JP | 2010024624 A | 2/2010 |
| JP | 2010-102227 A | 5/2010 |
| JP | 2010-282109 A | 12/2010 |
| JP | 2011-14593 A | 1/2011 |
| JP | 2011-503663 A | 1/2011 |
| JP | 2011-75819 A | 4/2011 |
| JP | 2012-118130 A | 6/2012 |
| JP | 2012-133254 A | 7/2012 |
| JP | 2013-537721 A | 10/2013 |
| JP | 2014-225595 A | 12/2014 |
| JP | 2017518526 A | 7/2017 |
| JP | 2018-511838 A | 4/2018 |
| JP | 6305564 B2 | 4/2018 |
| JP | 2019-512721 A | 5/2019 |
| JP | 6526245 B2 | 5/2019 |
| JP | 6688402 B2 | 4/2020 |
| JP | 6824440 B2 | 1/2021 |
| JP | 6858276 B2 | 3/2021 |
| KR | 20000000118 U | 1/2000 |
| KR | 20000047899 A | 7/2000 |
| KR | 10-2067751 B1 | 1/2002 |
| KR | 1020040067701 A | 7/2004 |
| KR | 200366674 Y1 | 11/2004 |
| KR | 20050033986 A | 4/2005 |
| KR | 200401354 Y1 | 11/2005 |
| KR | 20060016469 A | 2/2006 |
| KR | 10-0563049 B1 | 3/2006 |
| KR | 20060054742 A | 5/2006 |
| KR | 10-2006-0070176 A | 6/2006 |
| KR | 100666961 B1 | 1/2007 |
| KR | 1020070070675 A | 4/2007 |
| KR | 10-2007-0048300 A | 5/2007 |
| KR | 1020070048294 | 8/2007 |
| KR | 10-2013-0126034 A | 11/2013 |
| KR | 101764381 B1 | 7/2017 |
| KR | 10-1847151 B1 | 4/2018 |
| KR | 10-1853885 B1 | 5/2018 |
| KR | 10-1868077 B1 | 6/2018 |
| KR | 10-1885884 B1 | 7/2018 |
| KR | 10-1894027 B1 | 8/2018 |
| KR | 10-1904363 B1 | 9/2018 |
| KR | 10-1958375 B1 | 3/2019 |
| KR | 10-2010515 B1 | 8/2019 |
| KR | 10-2063885 | 1/2020 |
| KR | 10-2104342 B1 | 4/2020 |
| KR | 10-2109072 B1 | 5/2020 |
| KR | 10-2165778 B1 | 10/2020 |
| KR | 10-2262912 B1 | 6/2021 |
| KR | 10-2267374 B1 | 6/2021 |
| KR | 10-2306650 B1 | 9/2021 |
| KR | 10-2379046 B1 | 3/2022 |
| KR | 10-2400990 B1 | 5/2022 |
| KR | 10-2501211 B1 | 2/2023 |
| RU | 2513043 C2 | 4/2014 |
| WO | WO2005079129 A1 | 8/2005 |
| WO | WO2007/116117 A1 | 10/2007 |
| WO | WO2007116116 A1 | 10/2007 |
| WO | WO2008050660 A2 | 5/2008 |
| WO | WO2008/102050 A1 | 8/2008 |
| WO | WO2009/047390 A1 | 4/2009 |
| WO | WO2009065125 A2 | 5/2009 |
| WO | WO2009065125 A3 | 5/2009 |
| WO | WO2009135308 A1 | 11/2009 |
| WO | WO2010007821 A1 | 2/2010 |
| WO | WO2010080624 A2 | 7/2010 |
| WO | WO2011069084 A3 | 6/2011 |
| WO | WO2011072217 A3 | 6/2011 |
| WO | WO2011140179 A2 | 11/2011 |
| WO | WO2011150078 A2 | 12/2011 |
| WO | WO2012021573 A2 | 2/2012 |
| WO | WO2012024426 A3 | 2/2012 |

(56) References Cited

FOREIGN PATENT DOCUMENTS

| | | |
|---|---|---|
| WO | WO2013/182733 A1 | 12/2013 |
| WO | WO2014062815 A1 | 4/2014 |
| WO | WO2014149773 A1 | 9/2014 |
| WO | WO2014150036 A1 | 9/2014 |
| WO | WO2015/138609 A2 | 9/2015 |
| WO | WO2015168375 A1 | 11/2015 |
| WO | WO2016/102980 A1 | 6/2016 |
| WO | WO2016102982 A1 | 6/2016 |
| WO | WO2016127613 A1 | 8/2016 |
| WO | WO2016133852 A1 | 8/2016 |
| WO | WO2017152166 A1 | 9/2017 |
| WO | WO2018/200260 A1 | 11/2018 |
| WO | WO2018/200905 A1 | 11/2018 |
| WO | WO2020/081687 A1 | 4/2020 |
| WO | WO2020/205305 A1 | 10/2020 |
| WO | WO2022/087488 A1 | 4/2022 |
| WO | WO2023/096738 A1 | 6/2023 |

OTHER PUBLICATIONS

ITSENCLOSURES, Standard Product Data Sheet, 2011, 18 pages.
SUNBRITETV, All Weather Outdoor LCD Television Model 4610HD, 2008, 1 page.
SUNBRITETV, Introduces Two New All-Weather Outdoor Televisions InfoComm 2008, 7 pages.
ITSENCLOSURES, Viewstation, 2017, 16 pages.
Novitsky, Driving LEDs versus CCFLs for LCD backlighting, Nov. 12, 2007, 6 pages.
Federman, Cooling Flat Panel Displays, 2011, 4 pages.
Zeeff, T.M., EMC analysis of an 18" LCD monitor, 2000, 1 page.
Vertigo Digital Displays, Innovation on Display FlexVu Totem Brochure, 2014, 6 pages.
Vertigo Digital Displays, FlexVu Totem Shelter, 2017, 2 pages.
Vertigo Digital Displays, All Products Catalogue, 2017,14 pages.
Adnation, Turn Key Advertising Technology Solutions, May 23, 2017, 4 pages.
Civiq Smartscapes, FlexVue Ferro 55P/55L, Mar. 16, 2017, 4 pages.
Wankhede, Evaluation of Cooling Solutions for Outdoor Electronics, Sep. 17-19, 2007, 6 pages.
Bureau of Ships Navy Department, Guide Manual of Cooling methods for Electronic Equipment, Mar. 31, 1955, 212 pages.
Civiq, Invalidity Claim Charts, Appendix A—Appendix D, Jan. 24, 2018, 51 pages.
Civiq, Invalidity Contentions, Jan. 24, 2018, 51 pages.
Scott, Cooling of Electronic Equipment, Apr. 4, 1974, 119 pages.
Sergent, Thermal Management Handbook for Electronic Assemblies, Aug. 14, 1998, 190 pages.
Steinberg, Cooling Techniques for Electronic Equipment First Edition, 1980, 255 pages.
Steinberg, Cooling Techniques for Electronic Equipment Second Edition, 1991, 299 pages.
Yeh, Thermal Management of Microelectronic Equipment, Oct. 15, 2002, 148 pages.
Civiq, Invalidity Claim Chart, Appendix I, Mar. 22, 2018, 4 pages.
Civiq, Invalidity Claim Charts, Appendix F to H, Mar. 22, 2018, 18 pages.
Yung, Using Metal Core Printed Circuit Board as a Solution for Thermal Management article, 2007, 5 pages.
*Civiq Smartscapes, LLC v. Manufacturing Resources International, Inc.*, Memorandum Opinion re claim construction, Sep. 27, 2018, 16 pages.
*Civiq Smartscapes, LLC V. Manufacturing Resources International, Inc.*, Claim Construction Order, Oct. 3, 2018, 2 pages.
Anandan, Munismay, Progress of LED backlights for LCDs, Journal of the SID, 2008, pp. 287-310, 16/2.
Melford Technologies, Part 2, video online at https://m.youtube.com/watch?v=znlyHWozwDA, Oct. 21, 2019, 1 page.
Mentley, David E., State of Flat-Panel Display Technology and Future Trends, Proceedings of the IEEE, Apr. 2002, vol. 90, No. 4, pp. 453-459.
Rohsenow, Warren M., Handbook of Heat Transfer, Third Edition, 1998, select chapters, 112 pages, McGraw-Hill.
The American Heritage College Dictionary, Third Edition, 1993, excerpt, 3 pages, Houghton Mifflin Company.
*Civiq Smartscapes LLC. v. Manufacturing Resources International, Inc.*, Petition for Inter Partes Review of U.S. Pat. No. 8,854,572 including Declaration of Greg Blonder in Support of Petition, Curriculum Vitae of Greg Blonder and Prosecution History of U.S. Pat. No. 8,854,572, Petition filed Mar. 14, 2018, 427 pages.
*Civiq Smartscapes LLC. v. Manufacturing Resources International, Inc.*, Defendant's Amended Answer and Counterclaims to Plaintiff's First Amended Complaint, Filed Apr. 24, 2018, 240 pages.
*Civiq Smartscapes, LLC v. Manufacturing Resources International, Inc.*, Memorandum Order re "rear surface of the electronic display" term construction, Mar. 5, 2019, 3 pages.

\* cited by examiner

ELECTRONIC DISPLAY ASSEMBLY WITH FABRIC PANEL COMMUNICATIONS BOX

CROSS-REFERENCE TO RELATED APPLICATIONS

This application claims the benefit of U.S. provisional patent application Ser. No. 63/392,032 filed Jul. 25, 2022, the disclosures of which are hereby incorporated by reference as if fully restated herein.

TECHNICAL FIELD

Exemplary embodiments relate generally to electronic display assemblies with fabric panel communications boxes, and systems and methods related to the same.

BACKGROUND AND SUMMARY OF THE INVENTION

It has become increasingly desirable to include certain electronic equipment with display assemblies featuring electronic displays. Such electronic equipment may include, for example, communications equipment, sensing equipment, combinations thereof, and the like. For example, advertising or announcements may be displayed at the electronic displays and internet connectivity may be facilitated by the electronic equipment. Such electronic displays and electronic equipment may be provided in ruggedized housings to protect the electronic displays and equipment from harsh environmental conditions. Sometimes, at least some of the electronic equipment is provided in a box above the electronic displays. An example of such an assembly includes US Pub. No. 2022/0110227 published Apr. 7, 2022 (the "'227 Publication"). The elevated position of the box may facilitate signal propagation and reception. The electronic equipment located in the box may generate heat and have cooling requirements. However, certain types of signals may be difficult to transmit or receive through certain materials.

What is needed is an electronic display assembly with a communications box which facilitates thermal management as well as signal transmission and reception. An electronic display assembly with a communications box having one or more fabric panels is disclosed. The fabric panels may facilitate thermal management, such as cooling, and/or signal transmission and/or reception.

Advancements in network communications, particularly in wireless communications technology, have brought about equipment with greater power consumption. These higher power level operations may increase heat production, which likewise increases cooling needs. These advancements may, alternatively or additionally, utilize signal types which are attenuated by certain materials. One such example, without limitation, is "5G" wireless technology, which may, for example, consume on the order of 500-700 watts during normal operations and whose signals may see significant attenuation through materials such as metals and glass.

The fabric panel(s) of the communications box may be snap fitted to one or more frames, by way of non-limiting example. This may permit the panels to be periodically changed, for example. The fabric panels may comprise patterned apertures which may permit ingestion and/or exhaustion of ambient air, such as by way of passive airflow. Alternatively, or additionally, an intake/exhaust area may be provided along an upper edge of the communications box with or without fans, such as for active cooling of the communications box. Alternatively, or additionally, fans may be located within the communications box, such as for forcing ingestion and/or exhaustion of ambient air through the fabric panels. The communications box may be fluidly separated from, or connected to, side assemblies. The side assemblies may be located below the communications box and comprise electronic displays. The assembly may comprise other airflow pathways. Wireless networking equipment and/or other electronic equipment may be housed within the communications box to receive airflow, such as for cooling. Other electronic equipment may be located within the assembly, such as for operating the side assemblies or providing other features.

Further features and advantages of the systems and methods disclosed herein, as well as the structure and operation of various aspects of the present disclosure, are described in detail below with reference to the accompanying figures.

BRIEF DESCRIPTION OF THE DRAWINGS

In addition to the features mentioned above, other aspects of the present invention will be readily apparent from the following descriptions of the drawings and exemplary embodiments, wherein like reference numerals across the several views refer to identical or equivalent features, and wherein.

DETAILED DESCRIPTION OF EXEMPLARY EMBODIMENT(S)

Various embodiments of the present invention will now be described in detail with reference to the accompanying drawings. In the following description, specific details such as detailed configuration and components are merely provided to assist the overall understanding of these embodiments of the present invention. Therefore, it should be apparent to those skilled in the art that various changes and modifications of the embodiments described herein can be made without departing from the scope and spirit of the present invention. In addition, descriptions of well-known functions and constructions are omitted for clarity and conciseness.

Embodiments of the invention are described herein with reference to illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Figure 1:
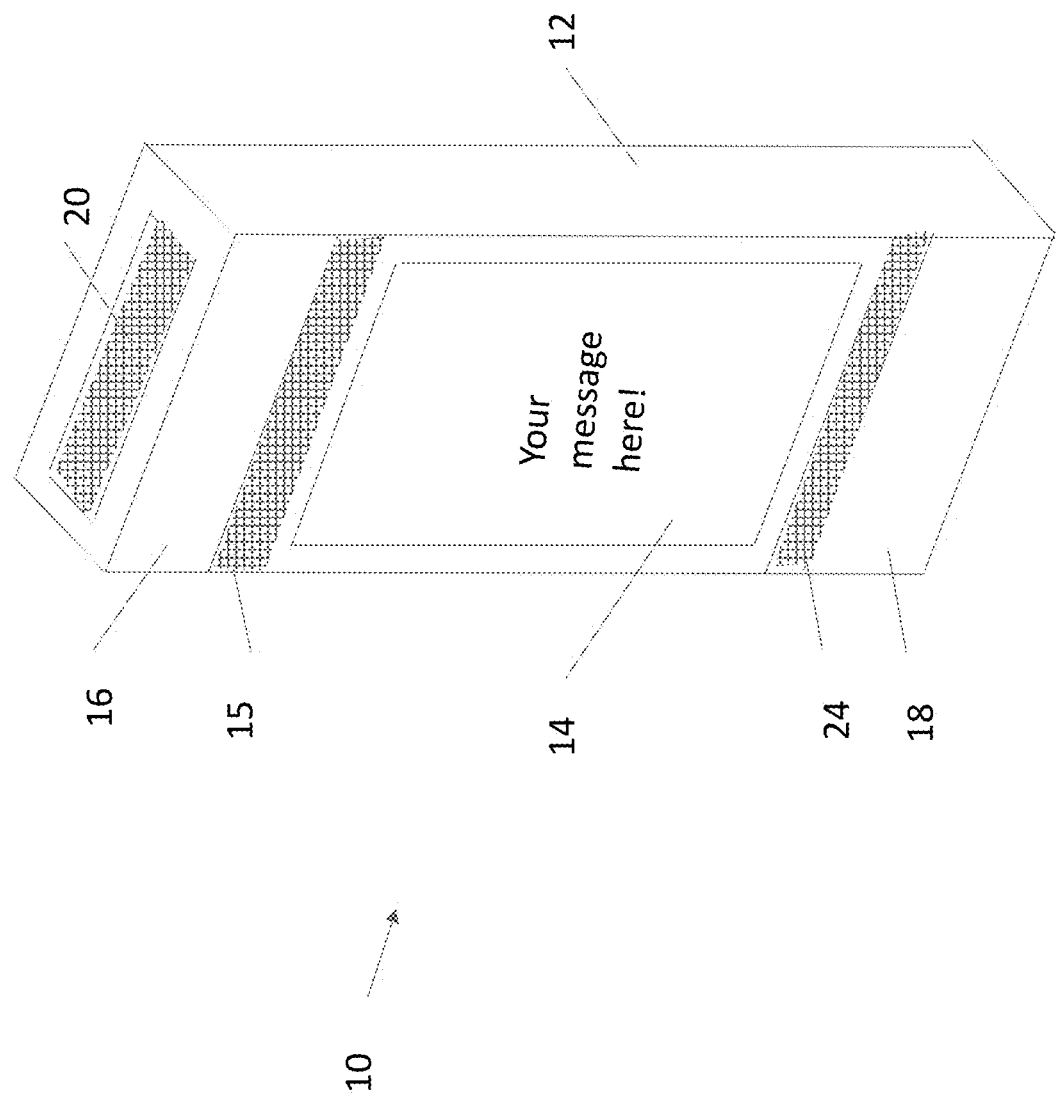
FIG. 1 is a perspective view of an exemplary display assembly.
Figure 2:
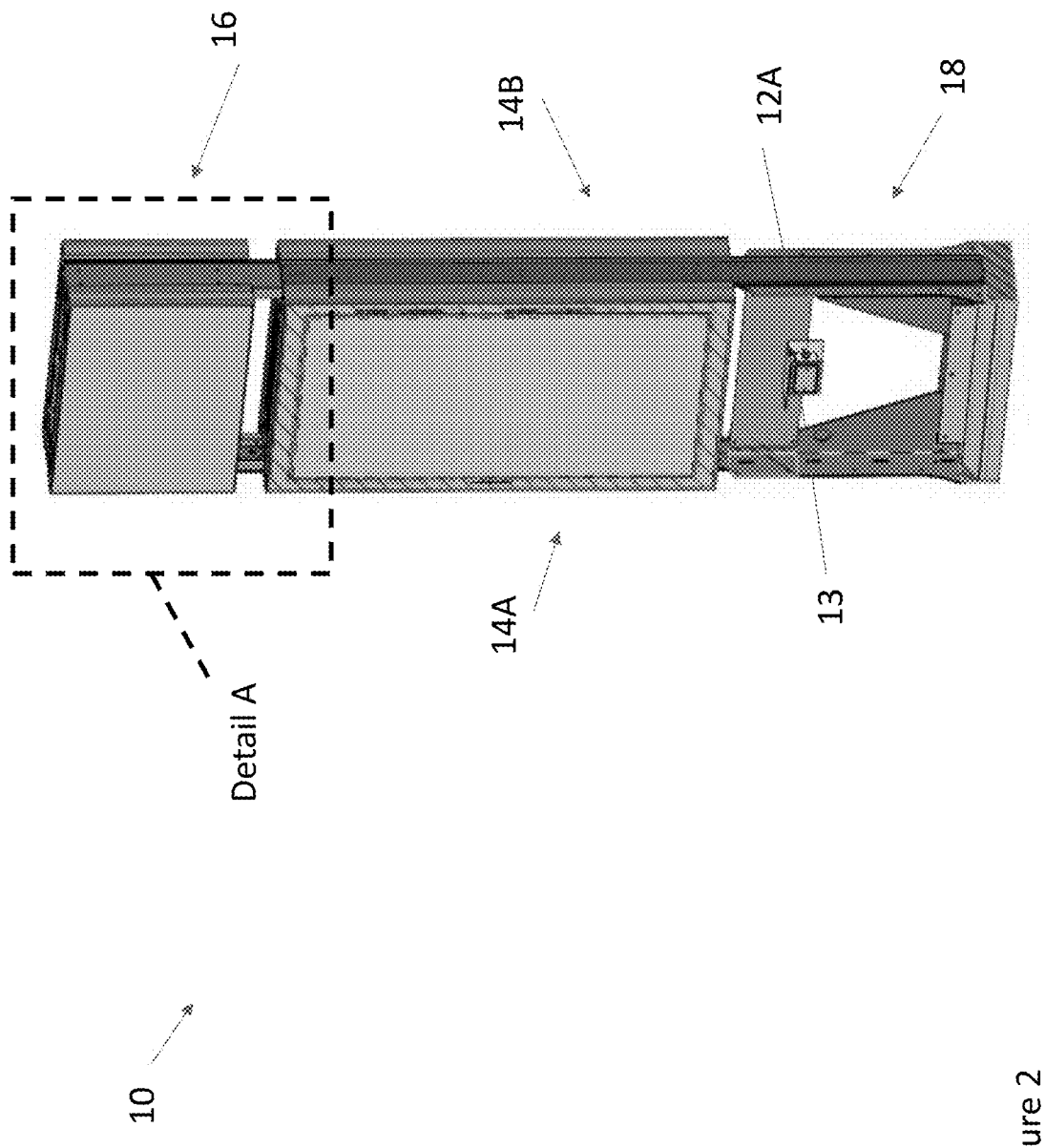
FIG. 2 is a perspective view of another exemplary display assembly with certain cladding components removed to reveal internal components, also indicating Detail A.

Referring particularly to FIG. 1 and FIG. 2, an exemplary display assembly 10 is illustrated. The display assembly 10 may comprise a mounting structure 12. The mounting structure 12 may comprise one or more members arranged into a framework. The mounting structure 12 may comprise one or more external cladding components, such as panels. The mounting structure 12 may serve as a chassis and/or housing for components of the display assembly 10. The mounting structure 12 may be configured to facilitate mounting the assembly 10 to a surface, such as but not limited to, a sidewalk, parking lot, ground, wall, building, combinations thereof, or the like.

The display assembly 10 may comprise one or more electronic display subassemblies 14. For example, without limitation, a first and second electronic display subassembly 14A, 14B may be positioned in a back-to-back arrangement at the mounting structure 12, though any number and location of such electronic display subassemblies 14 may be utilized. The electronic display subassemblies 14 may be moveably mounted to said mounting structure 12, such as, but not limited to, in a hinging fashion. Alternatively, or additionally, the display assembly 10 may comprise one or more static poster subassemblies, which may be configured to house one or more static posters in an illuminated or non-illuminated fashion and/or one or more black covers such as in place of one or more of the electronic display subassemblies 14.

The display assembly 10 may comprise a communications box 16. In exemplary embodiments, without limitation, the communications box 16 may be located above, and spaced apart from, and upper edge of the one or more electronic display assemblies 14, though such is not required.

The display assembly 10 may comprise a lower compartment 18. The lower compartment 18 may be located below the one or more electronic display assemblies 14. The lower compartment 18, in exemplary embodiments without limitation, may be at least partially defined by at least a first portion of the mounting structure 12A. The lower compartment 18 may be configured to house one or more electronic equipment items 13. Such electronic equipment items 13 may comprise, for example, without limitation, processors, electronic storage devices, power modules, power transformers, bulk energy storage devices, video players, wiring (e.g., power, network connectivity), network connectivity devices, combinations thereof, or the like. The lower compartment 18 may, alternatively or additionally, serve to elevate the one or more electronic display assemblies 14 to an ergonomically viewable height.

The communication box 16, in exemplary embodiments without limitation, may be at least partially defined by at least a second portion of the mounting structure 12B. The second portion of the mounting structure 12B may comprise one or more framework members which elevate the communication box 16 above the one or more electronic display assemblies 14 such that it is spaced apart from the one or more electronic display assemblies 14. Some or all of the second portion of the mounting structure 12B and/or communication box 16 may comprise fiberglass, polymer, or the like, which may permit improved signal transmission and/or reception over metal, by way of non-limiting example. Coverings, grills, cladding, combinations thereof, or the like, may extend between the one or more electronic display assemblies 14 and the communications box 16, though such is not required.

Each of the one or more electronic display assemblies 14 may comprise, for example, without limitation, one or more of: an electronic display layer, a backlight, one or more airflow pathways (e.g., open loop, closed loop, for ambient air, for circulating gas, combinations thereof, or the like), electronic components (e.g., processors, electronic storage devices, timing and control boards, video players, combinations thereof, or the like), one or more optical films, diffusion layers, fans, combinations thereof, or the like. The electronic display subassemblies 14 may comprise of any type of electronic display including, but not limited to, LCD displays, LED displays, plasma displays, OLED displays, or the like. Such electronic displays may be directly backlit, edge lit, combinations thereof, or the like.

The display assembly 10 may comprise one or more intake areas 15. The one or more intake areas 15 may be located on, at, along, or above an upper edge of the one or more electronic display assembles 14. The one or more intake areas 15 may comprise one or more apertures, grills, holes, filters, combinations thereof, or the like configured to facilitate the ingestion of ambient air, such as for thermally managing the electronic display assemblies 14. In exemplary embodiments, without limitation, a single intake area 15 is common to all of the one or more electronic display assembles 14, though separate intake areas 15 may be utilized.

The display assembly 10 may comprise one or more exhaust areas 24. The one or more exhaust areas 24 may be located on, at, along, or below the one or more electronic display assemblies 14. The one or more exhaust areas 24 may comprise one or more apertures, grills, holes, filters, combinations thereof, or the like configured to facilitate the exhaustion of the ingested ambient air from the assembly 10, such as after used to extract heat from the electronic display assemblies 14. The one or more exhaust areas 24 may be fluidly connected to the one or more intake areas 15. In exemplary embodiments, without limitation, separate exhaust areas 24 may be used for each of the one or more electronic display assembles 14, though common exhaust area(s) 26 may be utilized.

The communications box 16 may be spaced apart from the one or more display assemblies 14 to facilitate ingestion of ambient air into the one or more intake areas 15 for the one or more display assemblies 14 and/or other portions of the assembly 10 not forming part of the communications box 16 in exemplary embodiments, without limitation. This may provide partial or entire fluid separation between ambient air ingested into the one or more electronic display assemblies 14 and any ambient air ingested into the communications box 16. This may advantageously limit or prevent preheating of ambient air ingested into the one or more electronic display assemblies 14, which, for example, might otherwise be provided where passed through the communications box 16 first.

Figure 3:
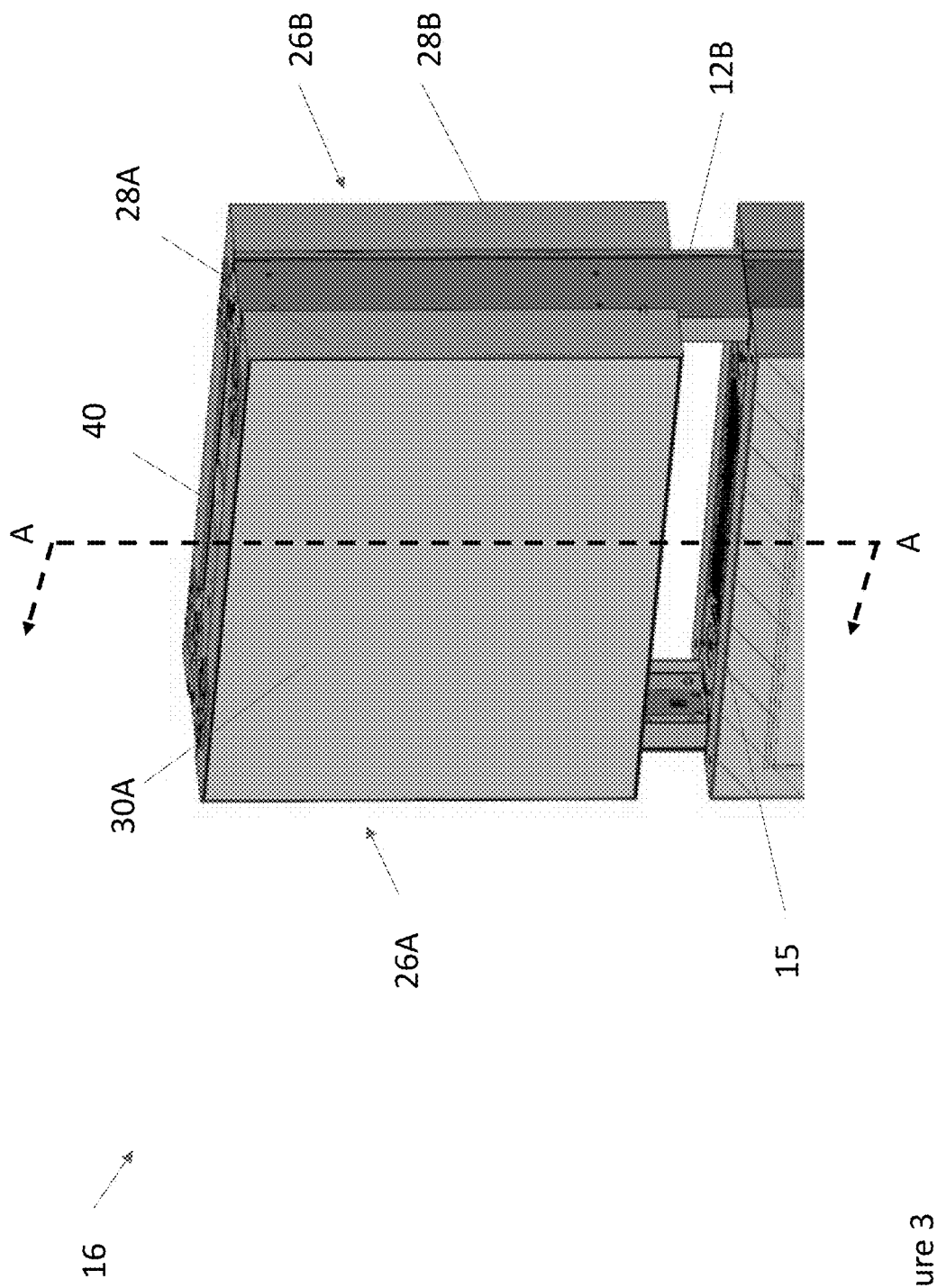
FIG. 3 is a detailed perspective view of a communications box of Detail A of the display assembly of FIG. 2, also indicating section line A-A.
Figure 4:
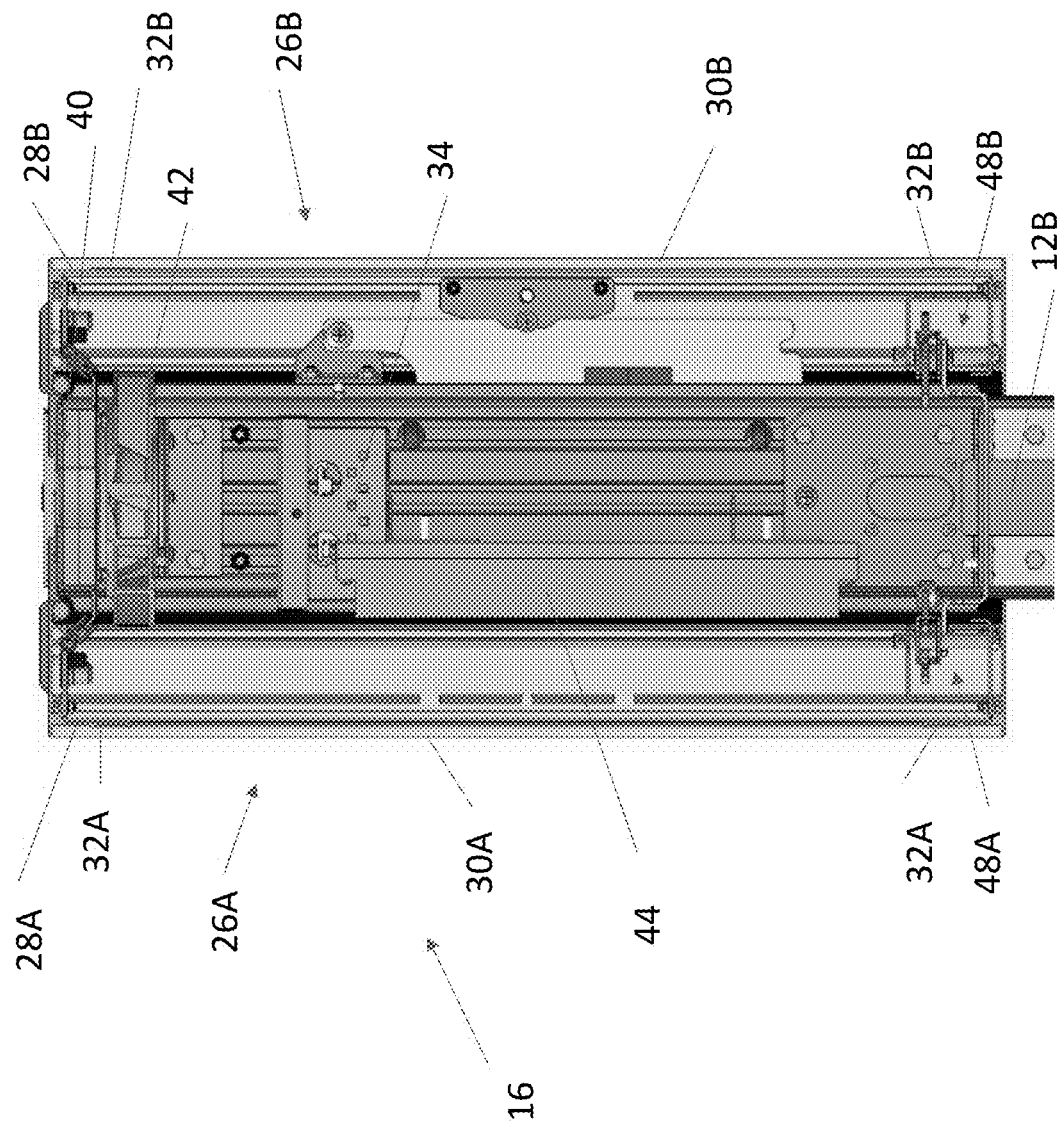
FIG. 4 is a side sectional view of the communications box taken along section line A-A of FIG. 3.
Figure 5:
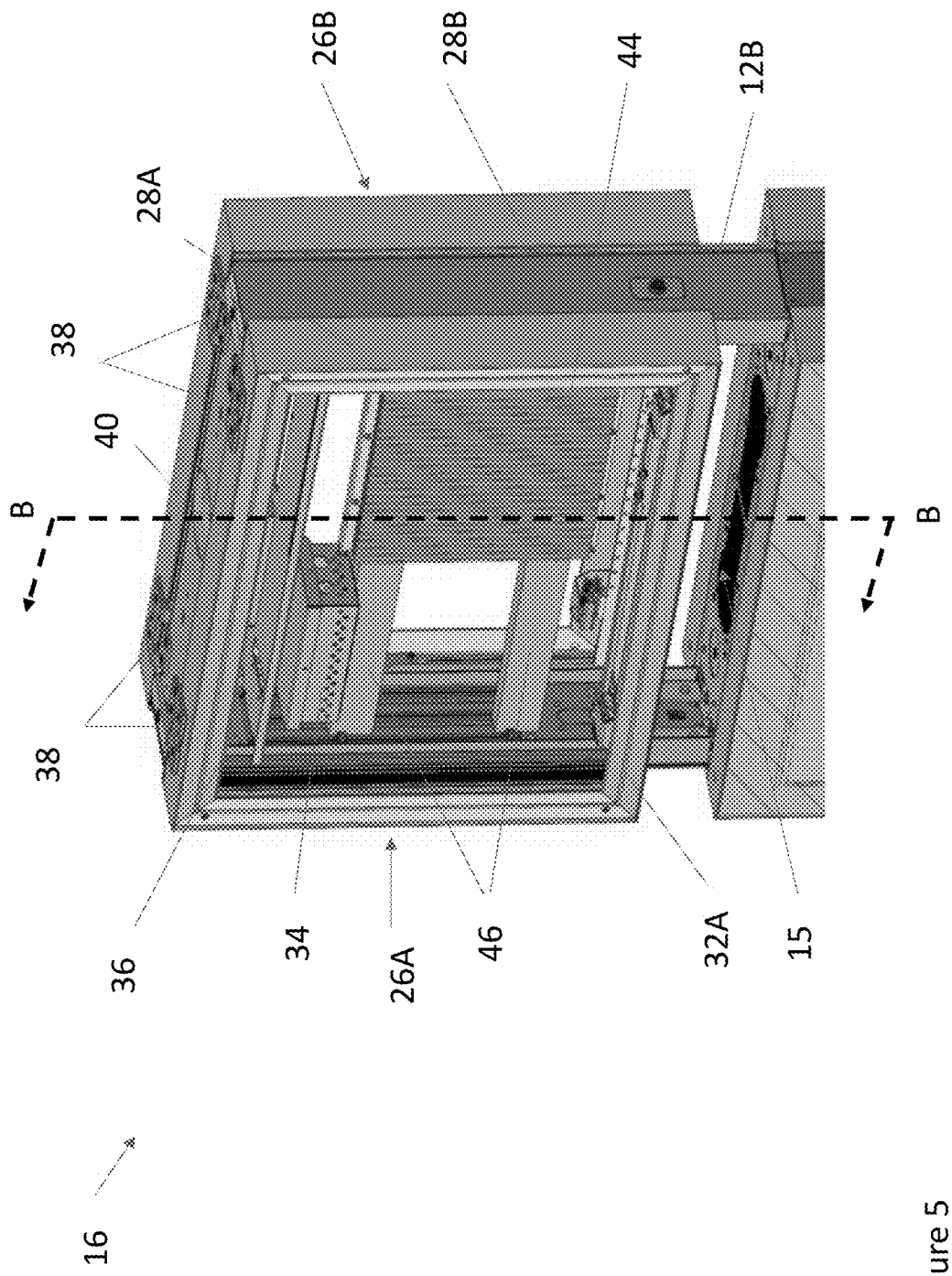
FIG. 5 is a perspective view of the communications box of FIG. 3 with certain fabric paneling removed to reveal internal components, also indicating section line B-B.

Referring particularly to FIG. 3 through FIG. 5, the communications box 16 may comprise a second portion of the mounting structure 12B. The second portion of the mounting structure 12B may comprise one or more members forming a framework, one or more cladding components, combinations thereof, or the like. Some or all components of the first and second portions of the mounting structure 12A, 12B may be common to one another or separate. The communications box 16 may comprise one or more panel frames 28. The one or more panel frames 28 may be connected to the second portion of the mounting structure 12B. The one or more panel frames 28 may be connected to the second portion of the mounting structure 12B in a moveable manner, such as by way of one or more hinging devices 38. In exemplary embodiments, without limitation, a first one of the panel frames 28A is connected to a first side of the mounting structure 12 and a second one of the panel frames 28B is connected to a second, opposing side of the mounting structure 12, though any number of panel frames 28 may be provided in any arrangement.

Each of the panel frames 28 may be configured to accept one or more fabric panels 30. In exemplary embodiments, without limitation, each of the panel frames 28 is configured to accept one of the fabric panels 30. Each of the panel frames 28, for example, without limitation, may comprise one or more securing structures 32. The securing structures 32 may comprise, for example, without limitation, one or more ridges, protrusions, clamps, apertures, pins, combinations thereof, or the like configured to removably receive and secure the fabric panels 30, such as, but not limited to, in a snap-fit, friction fit, fastened, and/or clamping arrangement, combinations thereof, or the like. The fabric panels 30 may be periodically removed and replaced, such as to facilitate changing of advertising images or announcements, replace dirty panels 30, to name a few non-limiting examples. The fabric panels 30 may alternatively be removed, cleaned, and re-installed. The fabric panels 30 may, alternatively or additionally, comprise one or more securing structures, such as, but not limited to, ridges, protrusions, clamps, apertures, pins, combinations thereof, or the like configured to interact with the securing structures 32 of the panel frames 28.

In exemplary embodiments, without limitation, each of the panel frames 28A, 28B may comprise a respective securing structure 32A, 32B, such as, but not limited to, in the form of a ridge which extends a perimeter or the panel frame 28 to receive one of the fabric panels 30 in a snap-fit type arrangement. Alternatively, or additionally, the securing structures 32 may comprise holes configured to receive shock cords, cable ties, rope, string, wire, combinations thereof, or the like, passed through the fabric panels 30, such as by way of corresponding apertures located in the same.

In exemplary embodiments, without limitation, each of the communications boxes 16 may comprise first and second frames 28A, 28B provided on opposing sides of the communications box 16 with a first and second panel 30A, 30B, respectively. However, the communications box 16 may comprise any number, arrangement, and/or type of frames 28 and/or panels 30. For example, without limitation, one side of the communications box 16 may comprise a frame 28A and fabric panel 30A while another comprises a metal and/or glass panel (with or without a frame 28B). Some or all of the frames 28, by way of example, may comprise fiberglass, polymer, or the like, which may permit improved signal transmission and/or reception over metal, by way of non-limiting example.

The fabric panels 30 may comprise, for example without limitation, a number of apertures. The apertures may be spaced and/or arranged randomly and/or in any pattern, such as, but not limited to, in a mesh, scrim, combinations thereof, or the like. The fabric panels 30 may comprise vinyl, polyester, combinations thereof, or the like. In exemplary embodiments, without limitation, the materials to apertures may be provided in a 70/30 and/or 80/20 ratio, though any ratio may be utilized. The fabric panels 30 may be configured to receive one or more printed images, such as for advertising or other announcements. Examples of suitable fabric panels 30, without limitation, include those available from Signs.com of Salt Lake City, UT (www.signs.com/mesh-banners/), Duratex of St. Louis, MO (www.duratex-media.com/8 oz-mesh-banner-with-liner.html), and/or Fellers Inc. of Tulsa OK (www.fellers.com/fellers-shopping/cat/banner-material/sub/mesh-perforated-banner/set/ultraflex-9-ounce-standard-holed-mesh). The apertures of the fabric panels 30 may be configured to permit airflow into and/or out of the communications box 16, in exemplary embodiments. The panels 30 may provide over 400 combined square inches of airflow openings in exemplary embodiments, without limitation, though any size, shape, and/or type of panels 30 and associated airflow openings may be provided.

The communications box 16 may comprise, or be configured to receive, one or more electronic equipment items. Examples of such electronic equipment items include, by way of non-limiting example, wireless network connectivity devices 44 (e.g., antennae, routers, wi-fi devices, 5G equipment (e.g., small cell), signal repeaters, mesh modes, cellular network device, combinations thereof, or the like), air quality sensors 34, temperature sensors, position measurement devices (e.g., GPS, triangulation devices), humidity sensors, magnetometers, air pressure sensors, edge computers, processors, electronic storage devices, controllers, power modules, bulk energy storage devices, transformers, combinations thereof, or the like.

The communications box 16 may be generally cuboid in shape, though such is not required. The communications box 16 may be sized and/or shaped to accommodate certain wireless network connectivity devices 44 capable of signaling and/or rotating in 360 degrees azimuth, or substantially 360 degrees azimuth, by way of non-limiting example. For example, without limitation, interior space of the communications box 16 may be sized to permit 360 degrees rotational azimuth movement of at least certain of the wireless network connectivity devices 44, such as without contacting any interior surfaces of the communication box 16 and/or components therein. As another example, without limitation, the communications box 16 and/or interior space may be round, curved, oblong, circular, spherical, ovoid, cube, cuboid, combinations thereof, or the like, to accommodate such rotation.

To account for partial occlusion of panel 30 material over time, equipment within the communications box 16 may be selected which cumulatively requires approximately 50 square inches of airflow openings in exemplary embodiments, without limitation, though any requirement may be utilized. The equipment within the communications box 16 may be water and/or dust resistant, such as up to various ingress protection code ("IPC") ratings (e.g., IP65, IP66, IP67).

The fabric panels 30 may provide shade and/or other solar protection to the electronics, such as, but not limited to the wireless network connectivity devices 44. The fabric panels 30 may, alternatively or additionally, act as a filter for ingested ambient air, such as by trapping debris. The fabric panels 30 may, alternatively or additionally, improve signal transmission and/or reception, such as compared to metal or glass panels. The fabric panels 30 may, alternatively or additionally, be printed or otherwise provided with advertisements, announcements, or other images, such as to increase available advertising space. Replacing the fabric panels 30 may be easier and less expensive that posters, boards, or the like.

One or more mounting devices 46, such as, but not limited to, rails, plates, surfaces, combinations thereof, or the like may be provided within the communications box 16, such as for receiving the electronic equipment. Portions of the mounting structure 12 may, alternatively or additionally, be configured to receive such electronic equipment.

One or more intake/exhaust areas 40 may be provided at the communications box 16. The one or more intake/exhaust areas 40 may comprise one or more apertures, grills, holes, filters, combinations thereof, or the like configured to facilitate the ingestion and/or exhaustion of ambient air, such as for thermally managing the communications box 16 or equipment thereof. The one or more intake/exhaust areas 40 may be located on, at, and/or along an upper edge of the communications box 16, though any number and/or location of intake/exhaust area(s) may be utilized. Multiple intake/exhaust areas 40 may be provided on, at, and/or along the upper edge of the communications box 16, by way of non-limiting example, and/or the intake/exhaust area(s) 40 may comprise multiple openings.

The intake/exhaust area 40 may comprise, or be located adjacent to, one or more fan assemblies 42. The one or more fan assemblies 42 may comprise any type or kind of fan, such as axial fan(s) and/or centrifugal fan(s). The fan(s) 42 may be operated to ingest ambient air into the communications box 16 and/or exhaust ambient air from the communications box 16. For example, without limitation, the fan(s) 42 may be configured and/or operated to ingest ambient air through the intake/exhaust area 40 where it is subsequently exhausted through the fabric panels 30. As another example, without limitation, the fan(s) 42 may be configured and/or operated to pull ambient air through the fabric panels 30 where it is subsequently exhausted through the intake/exhaust area 40. The fan(s) 42 may be configured for dedicated operation (e.g., ingestion or exhaustion) or may be reversable and/or reversibly operated such that ingestion and exhaustion may be reversed from time to time. The nature of the fabric panels 30 may permit the fan(s) 42 to operate less frequently and/or at lower speeds. In other exemplary embodiments, without limitation, the fan(s) 42 are not required and the communications box 16 may rely on passive airflow through the fabric panels 30.

The communications box 16 may be fluidly separated from the subassemblies 14, the one or more intake areas 15, and/or other areas of the assembly 10 in exemplary embodiments, without limitation. For example, without limitation, any ambient air ingested into the communications box 16 may have to first exit the communications box 16 and return to the ambient environment before being possibly re-ingested into the subassemblies 14, the one or more intake areas 15, and/or other areas of the assembly 10 (note: re-ingestion is not required). Movement back into the ambient environment may provide adequate mixing to reduce or avoid re-ingestion of pre-heated air.

Figure 6A:
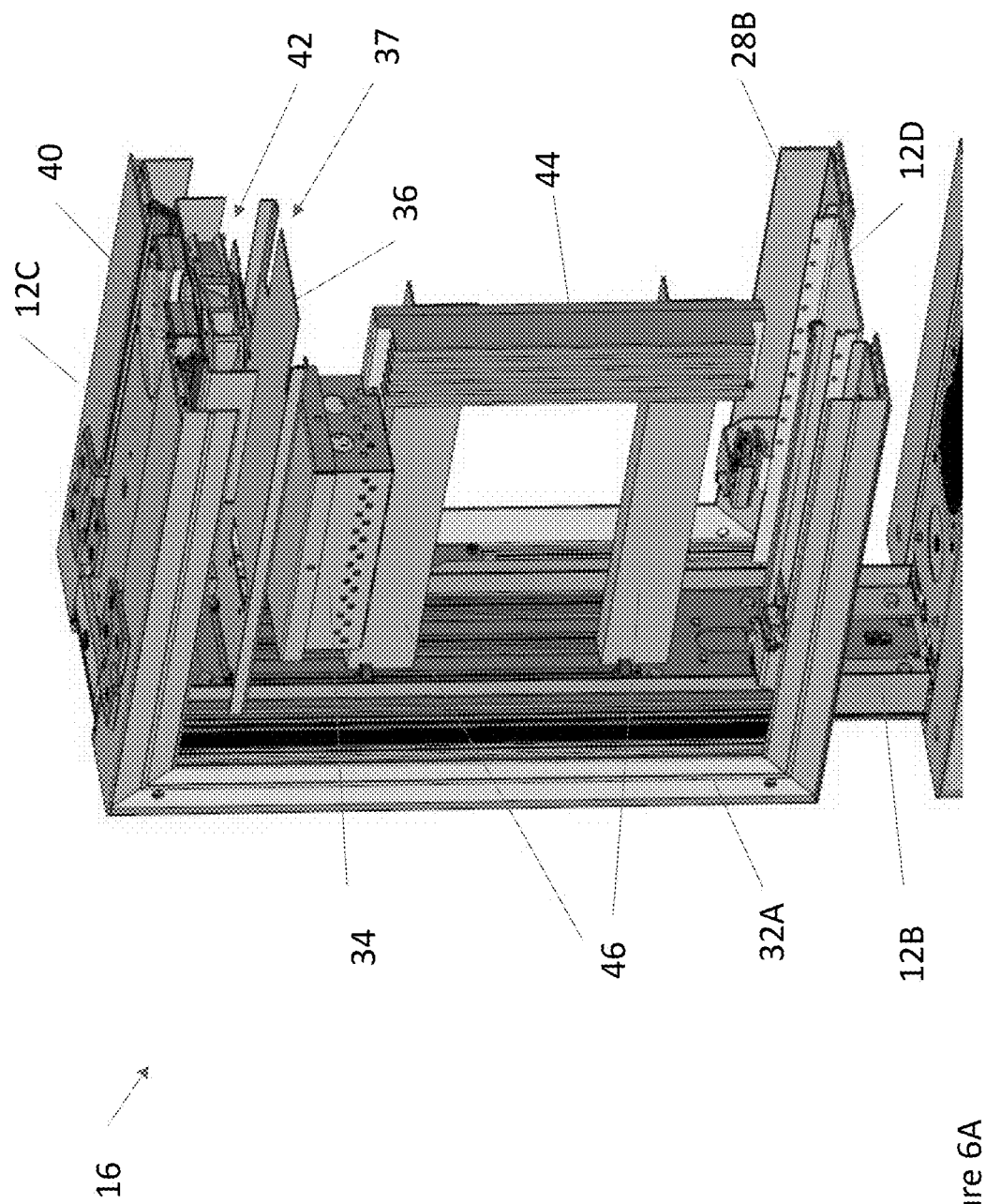
FIG. 6A is a perspective sectional view of an exemplary embodiment of the communications box taken along section line B-B of FIG. 5.
Figure 6B:
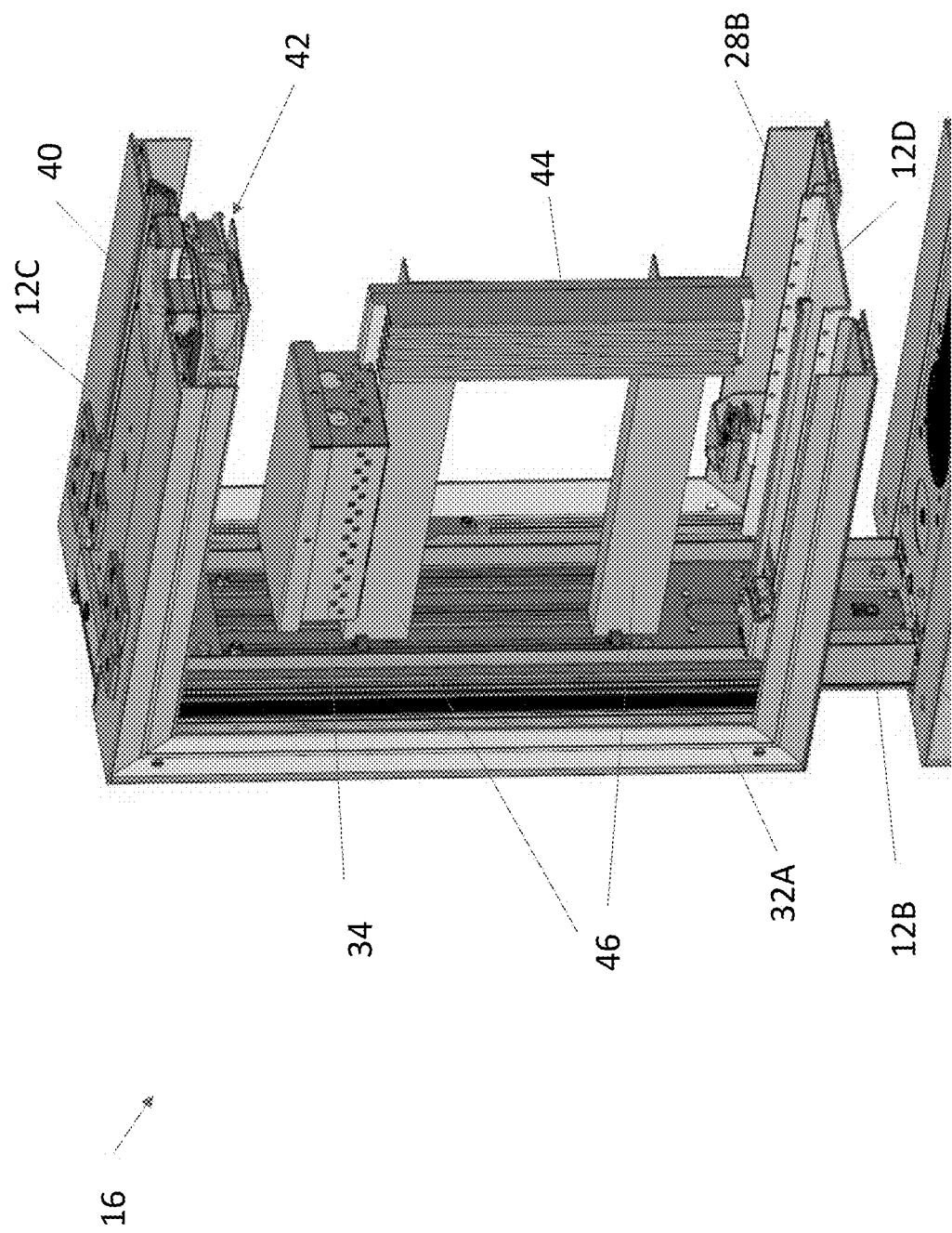
FIG. 6B is a perspective sectional view of another exemplary embodiment of the communications box taken along section line B-B of FIG. 5.

Referring particularly to FIG. 6A, the communication box 16 may comprise one or more convection aperture plates 36. The convection aperture plates 36 may comprise one or more apertures 37. The convection aperture plates 36 and/or other components of the communications box 16 may be as shown and/or described in the '227 Publication, the disclosures of which are hereby incorporated by reference as if fully restated herein. Referring particularly to FIG. 6B, the convection aperture plate(s) 36 are optional.

Figure 7:
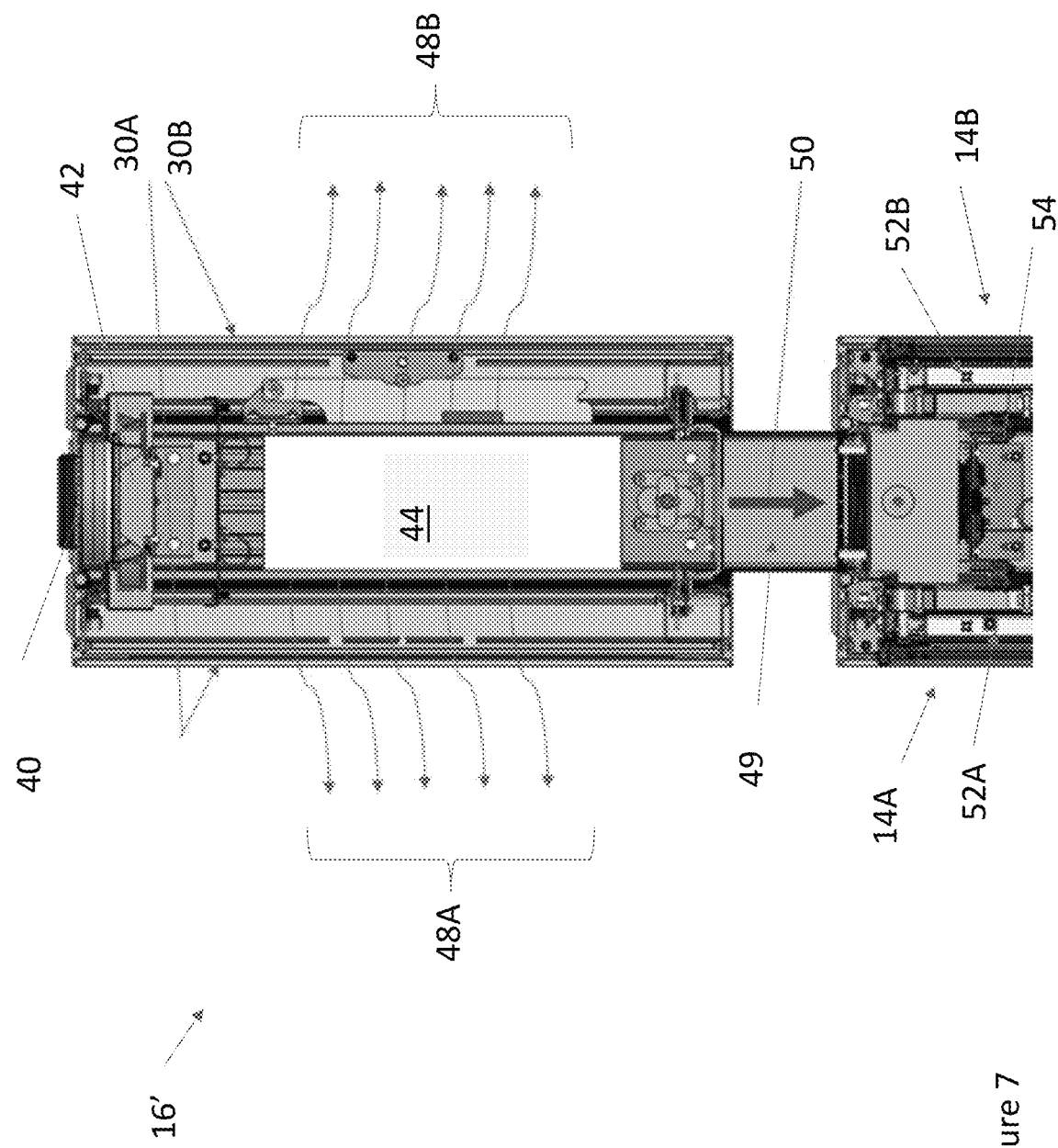
FIG. 7 is a side sectional view of another exemplary embodiment of the communications box taken along section line A-A of FIG. 3.

FIG. 7 illustrates another exemplary embodiment of the communications box 16'. Similar components may be numbered similarly with the addition of a prime (i.e., 16, 16'). The communications box 16' may be fluidly connected to some or all of the subassemblies 14, such as by way of one or more channels 49 extending between the communications box 16 and the subassemblies 14 and/or a central channel 54 of the assembly 10 as generally indicated by flow 50. The central channel 54 may be fluidly separate from, or connected to, the subassemblies 14. The assembly 10 and/or airflow may be as shown and/or described in the '227 Publication, by way of non-limiting example. However, the fabric panels 30A, 30B may provide an additional exhaust area for ambient air ingested through the one or more intake/exhaust areas 40. This may reduce or eliminate pre-heating of the ambient air subsequently passed into the subassemblies 14 and/or other portions of the assembly 10.

Use of the fan(s) 42 is optional. For example, without limitation, thermal management for electronic components of the communications box 16' may instead be accomplished through passive airflow into and/or out of the fabric panels 30. Furthermore, airflow may be reversed (e.g., on a dedicated and/or random or periodic basis) such that ambient air instead flows upward from the subassemblies 14 and/or central channel 54 into the communications box 16'.

Figure 8:
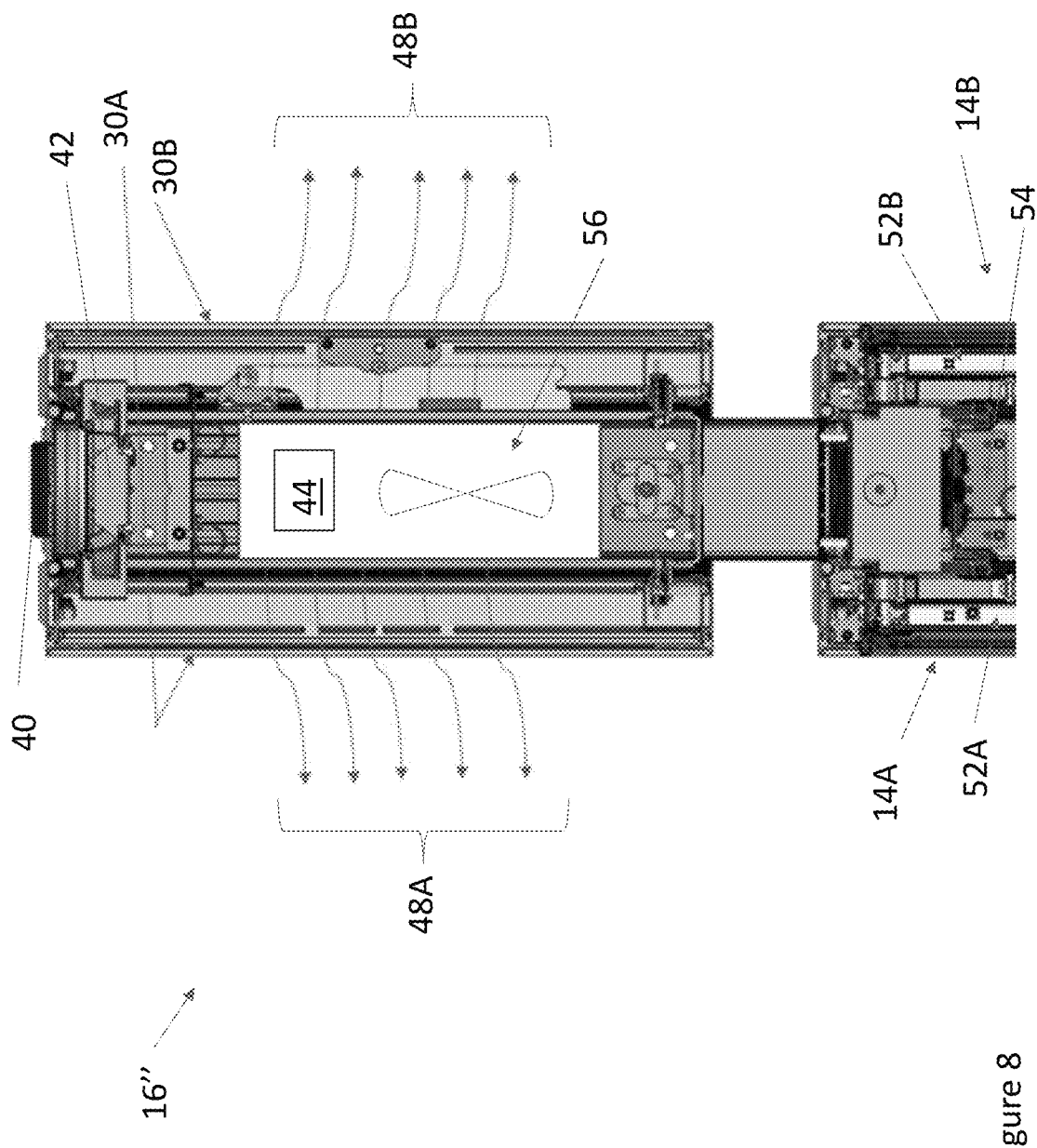
FIG. 8 is a side sectional view of another exemplary embodiment of the communications box taken along section line A-A of FIG. 3.

FIG. 8 illustrates another exemplary embodiment of the communications box 16". Similar components may be numbered similarly with the addition of a single or double prime (i.e., 16, 16', 16"). The communications box 16" may be fluidly separated from the subassemblies 14. One or more fans 56 may be positioned within the communication box 16" to force exhaustion of ingested ambient air through the fabric panels 30. The one or more fans 56 may alternatively, or additionally, be configured to force ingestion of ambient air through the fabric panels 30 and/or exhausted through the intake/exhaust area 40. The fan(s) 56 may be centrally located within the communications box 16, though any location may be utilized.

The fan(s) 42, which are optional, may be used to further ingest and/or exhaust the ambient air through the panels 30 and/or the intake/exhaust area 40.

The fan(s) 56 and/or 42 may be configured for a dedicated flow direction, may be reversible and/or configured for reversible operation, such as on a periodic or random basis, for sometimes ingesting and sometimes exhausting ambient air through the panels 30 and/or intake/exhaust area 40.

In other exemplary embodiments, without limitation, the fan(s) 42 and/or intake/exhaust area(s) 40 may not be required. In such embodiments, by way of non-limiting example, the fan(s) 56 may be configured to ingest ambient air through one of the fabric panels 30A and exhaust the ambient air through a same and/or another one of the fabric panels 30B. Any of the panels 30 may be used for ingestion and/or exhaustion. The fan(s) 56 may be periodically reversed to change the direction of flow. This may help to dislodge any debris embedded into the panels 30 and/or prolong panel 30 life.

Figure 9:
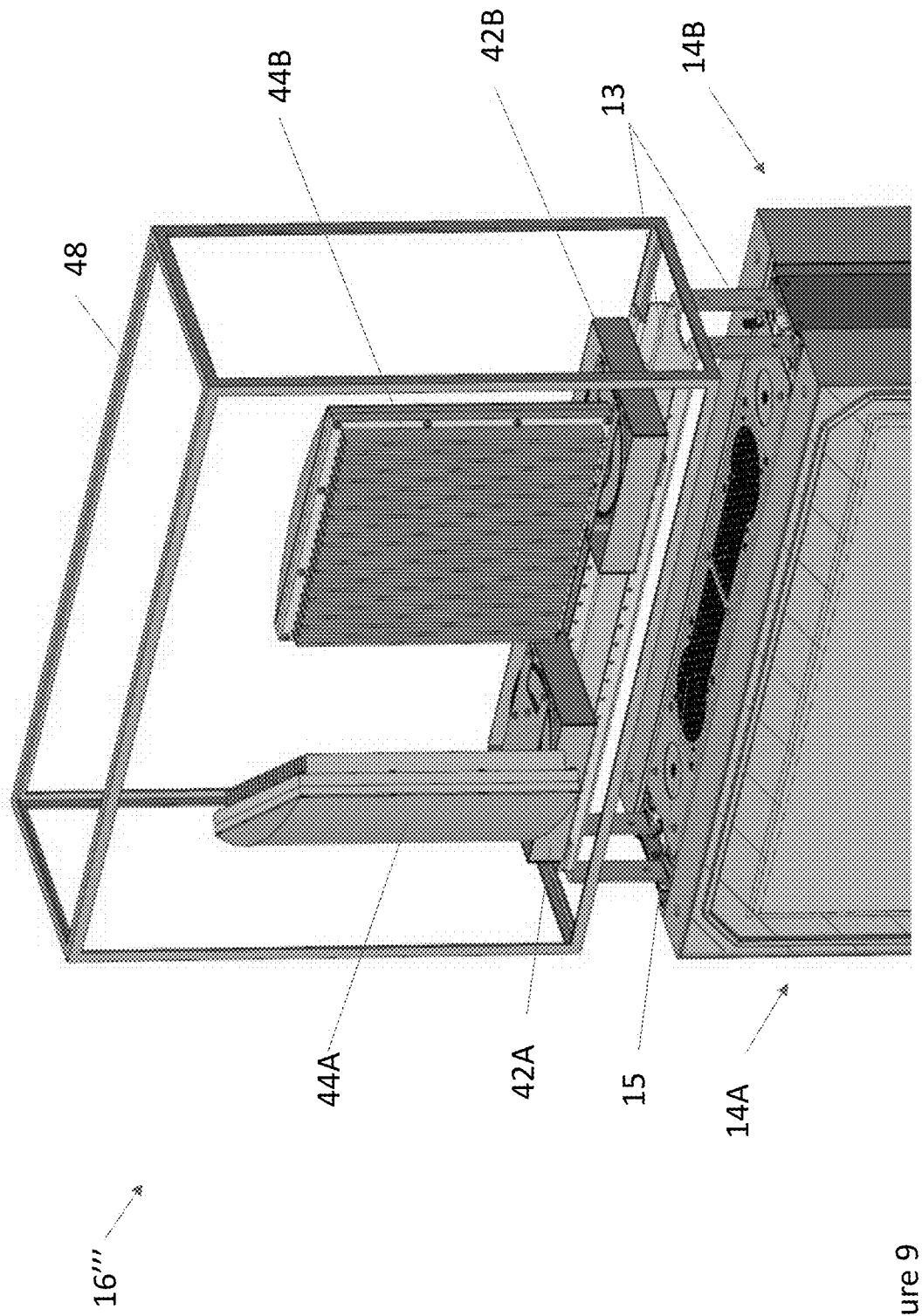
FIG. 9 is a detailed perspective view of another exemplary embodiment of the communications box.
Figure 10:
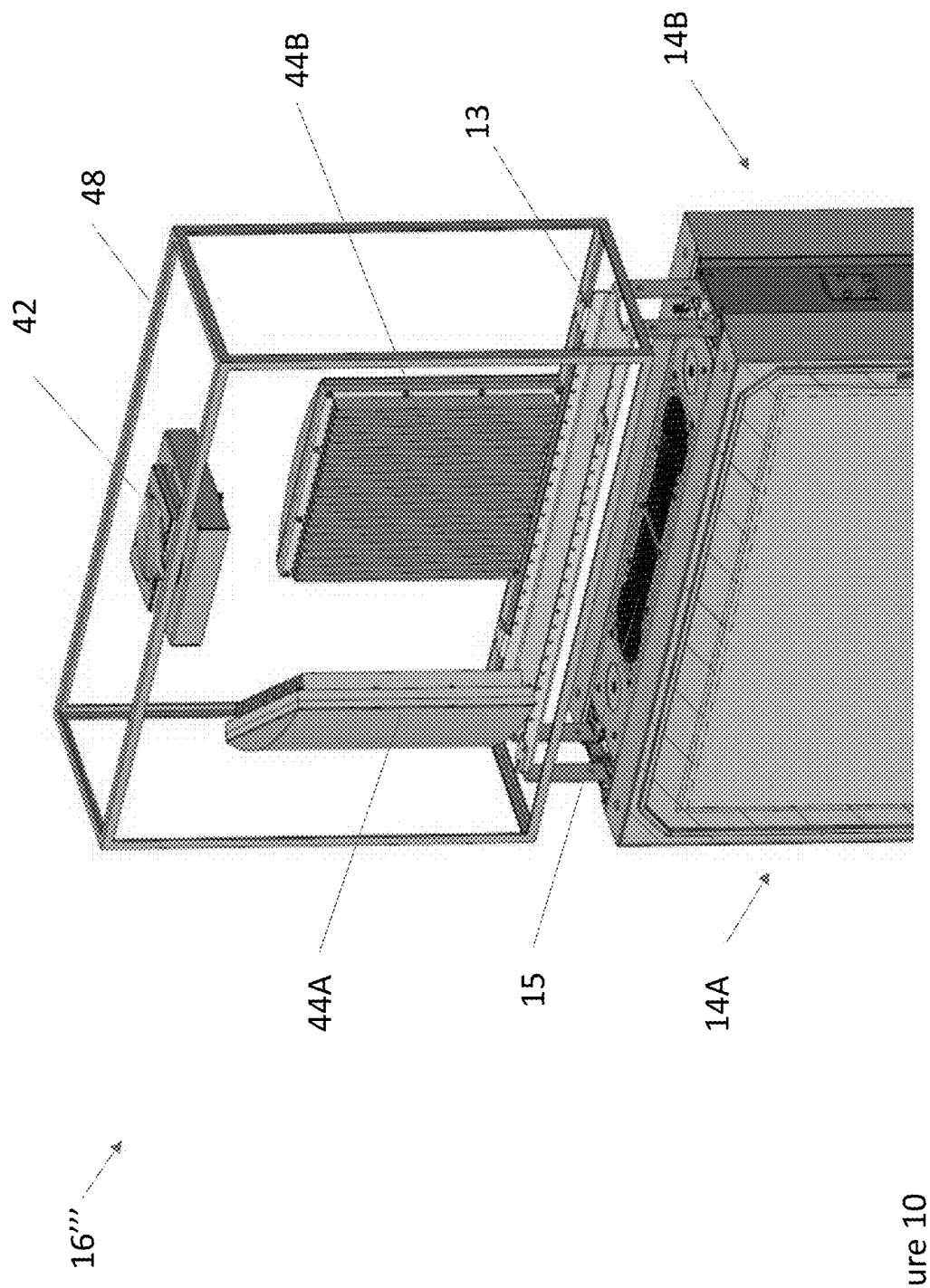
FIG. 10 is a detailed perspective view of another exemplary embodiment of the communications box.

FIG. 9 and FIG. 10 illustrate another exemplary embodiment of the communications box 16'''. Similar components may be numbered similarly with the addition of a single, double, or triple prime (i.e., 16, 16', 16", 16'''). The communications box 16''' may be partially or wholly fluidly separate from, or connected to, the subassemblies 14. The communications box 16''' may be elevated and spaced apart from the subassemblies 14.

A mounting platform 13 may extend from one or more of the subassemblies 14 and/or the mounting structure 12. The mounting platform 13 may elevate the communications box 16''' above and spaced apart from the intake(s) 15 to permit ingestion of ambient air. The mounting platform 13 may provide an elevated platform for one or more network connectivity devices 44A, 44B. In exemplary embodiments, without limitation, some or all of the network connectivity devices 44 may be configured for rotational movement, such as through a full 360 degrees of azimuth. Any number, type, and/or arrangement of network connectivity devices 44 may be utilized.

A framework subassembly 48 may be provided. The framework subassembly 48 may be connected to the mounting platform 13. Alternatively, or additionally, the framework subassembly 48 may be connected to the subassemblies 14 and/or the mounting structure 12. The framework subassembly 48 may comprise a number of members arranged into any of a number of shapes and/or sizes, such as, but not limited to, cube, cuboid, spherical, ovoid, combinations thereof, or the like. The members may comprise metallic and/or non-metallic material. The framework subassembly 48 may be configured to accommodate the one or more network connectivity devices 44, and optionally permit rotational movement of the same, such as through a full 360 degrees of azimuth.

The framework subassembly 48 may be configured to receive one or more of the fabric panels 30. The fabric panels 30 may be individually attached to the framework subassembly 48, such as one or more members thereof. The fabric panels 30 may be attached on a face-by-face basis, by way of non-limiting example. Such attachment may be accomplished by snap fitting, adhesive, fasteners (e.g., staples), sewing, combinations thereof, or the like. In exemplary embodiments, without limitation, the fabric panels 30 may comprise one or more pockets configured to accommodate some or all of the framework subassembly 48. For example, without limitation, the pockets may be slid over one or more members of the framework subassembly 48. The pockets may be sewn and/or may be selectively openable. For example, without limitation, the fabric panels 30 and/or the framework subassembly 48 may comprise, or be attached to, zippers, buttons, snaps, hook and loop fasteners, straps, buckles, combinations thereof, or the like for connecting the fabric panels 30 to the framework subassembly 48. Alternatively, or additionally, the fabric panels 30 may be provided or assembled into various shapes for fitting over one or more faces of the framework subassembly 48. For example, without limitation, the fabric panels 30 may comprise a partial cuboid shape configured to be stretched over, and snugly fit to, the framework subassembly 48. The fabric panels 30 may comprise stretchable material, one or more elastic bands, or be configured for closing about some or all of the framework subassembly 48, such as, but not limited to, by way of zippers, buttons, snaps, hook and loop fasteners, straps, buckles, combinations thereof, or the like. The fabric panels 30 may comprise, by way of non-limiting example, one or more attached protrusions configured to fit within one or more recesses of the framework subassembly 48, such as slots.

One or more fans 42 may be provided. As illustrated with particular regard to FIG. 9, multiple fans 42A, 42B may be positioned along the mounting platform 13. The mounting platform 13 may comprise one or more holes configured to permit airflow therethrough. As another example, without limitation, the fan(s) 42 may be attached to lower portions of the framework subassembly 48. As illustrated with particular regard to FIG. 10, the fan(s) 42 may be attached to upper portions of the framework subassembly 48. The fan(s) 42 may provide active cooling for the communications box 16'''. The fan(s) 42 may be configured to ingest and/or exhaust ambient air into or from the communications box 16''', such as through the fabric panels 30 in exemplary embodiments. Any number of fans 42 may be provided at any location(s) of the communications box 16'''.

In exemplary embodiments, without limitation, when attached, the fabric panels 30 may fully or partially enclose the communications box 16'''. For example, without limitation, air may be ingested and/or exhausted through the porous fabric material. As another example, without limitation, a bottom or other portion(s) of the fabric panels 30 may be partially or fully open to accommodate the mounting platform 13 and/or permit increased airflow. As another example, without limitation, a top portion may be partially or fully open to permit increased airflow.

Airflow through the communications box 16''' may be partially or fully separate from airflow for the subassemblies 14 and/or may be connected. For example, without limitation, air ingested through the communications box 16''' may be permitted or directed to the intake(s) 15. However, such is not required. Alternatively, or additionally, one or more diverters, barriers, baffles, or the like may be installed between the communications box 16''' and the intake(s) 15. The fabric panels 30 may be sized to extend to the subassemblies 14 and/or the mounting structure 12, such as to present a seamless appearance, though such is not required. In other exemplary embodiments, without limitation, a gap may be provided between the communications box 16''' and the subassemblies 14. The gap may be covered by one or more grills, filters, combinations thereof, or the like, though such is not required.

In other exemplary embodiments, without limitation, the fan(s) 42 and/or 56 may not be required in the communications box 16''', which may instead rely on passive airflow through the panel(s) 30.

Fluid separation shown and/or described herein may, for example, without limitation, be in accordance with various IPC ratings (e.g., IP65, IP66, IP67).

The assembly 10 may comprise additional electronic equipment, including but not necessarily limited to, electric vehicle ("EV") charging equipment.

Any embodiment of the present invention may include any of the features of the other embodiments of the present invention. The exemplary embodiments herein disclosed are not intended to be exhaustive or to unnecessarily limit the scope of the invention. The exemplary embodiments were chosen and described in order to explain the principles of the present invention so that others skilled in the art may practice the invention. Having shown and described exemplary embodiments of the present invention, those skilled in the art will realize that many variations and modifications may be made to the described invention. Many of those variations and modifications will provide the same result and fall within the spirit of the claimed invention.

Certain operations described herein may be performed by one or more electronic devices. Each electronic device may comprise one or more processors, electronic storage devices, executable software instructions, combinations thereof, and the like configured to perform the operations described herein. The electronic devices may be general purpose computers or specialized computing devices. The electronic devices may comprise personal computers, smartphone, tablets, databases, servers, or the like. The electronic connections and transmissions described herein may be accomplished by wired or wireless means. The computerized hardware, software, components, systems, steps, methods, and/or processes described herein may serve to improve the speed of the computerized hardware, software, systems, steps, methods, and/or processes described herein.

What is claimed is:

1. A display assembly comprising:
a mounting structure;
one or more electronic display subassemblies attached to the mounting structure; and
a communications box having a front panel and a rear panel defining, at least in part, an interior space for electronic equipment, wherein said communications box is attached to the mounting structure such that the front panel, the rear panel, and the interior space of the communications box is located above, and spaced apart from, the one or more electronic display subassemblies, and wherein at least one of said front panel and said rear panel comprises fabric which occupies at least a majority of an outward facing surface area thereof.

2. The display assembly of claim 1 wherein:
the fabric is permeable to ambient air.

3. The display assembly of claim 2 wherein:
both of the front panel and the rear panel comprise the fabric.

4. The display assembly of claim 2 further comprising:
one or more apertures at an upper surface of the communications box; and
one or more fans located within the interior space of the communications box, which when activated, ingest the ambient air through the one or more apertures and exhaust the ambient air through the fabric.

5. The display assembly of claim 2 further comprising:
one or more apertures at and upper surface and/or a lower surface of the communications box; and
one or more fans at the communications box, which when activated, ingest the ambient air through the fabric and exhaust the ambient air through the one or more apertures.

6. The display assembly of claim 1 further comprising:
an open loop airflow pathway extending within each of the one or more electronic display subassemblies;
an intake area for the open loop airflow pathway located at and at least partially between an upper portion of the one or more electronic display subassemblies;
a framework subassembly forming, at least in part, the front panel and the rear panel of the communications box; and
a mounting platform connecting the framework subassembly to the mounting structure such that the framework subassembly is spaced apart from the one or more electronic display subassemblies and the intake area.

7. The display assembly of claim 6 further comprising:
one or more apertures at a lower surface of the communications box;
one or more channels extending between the communications box and the one or more electronic display subassemblies; and
one or more fans at the communications box, which when activated, cause ambient air to travel through the fabric, the one or more apertures, the one or more channels, and the open loop airflow pathway of each of the one or more electronic display subassemblies.

8. The display assembly of claim 7 further comprising:
a second set of one ore more apertures located at an upper surface of the communications box, wherein the one or more fans, when activated, ingest a flow of the ambient air through the second set of the one or more apertures, exhaust a first portion of the ingested airflow through the fabric, and cause a second portion of the ingested airflow to travel through the one or more apertures and the one or ore channels towards the open loop airflow pathway of each of the one or more electronic display subassemblies.

9. The display assembly of claim 7 further comprising:
a second set of one or more apertures located at an upper surface of the communications box, wherein the one or more fans, when activated, ingest a flow of the ambient air through the second set one or more apertures, ingest a second flow of the ambient air through the fabric, and cause a combined flow of the ambient air to travel through the one ore more apertures and the one or more channels towards the loop airflow pathway of each of the one or more electronic display subassemblies.

10. The display assembly of claim 6 further comprising:
a closed loop airflow pathway extending within each of the one or more electronic display subassemblies.

11. The display assembly of claim 1 further comprising:
the electronic equipment, wherein said electronic equipment comprises wireless electronic communications equipment.

12. The display assembly of claim 11 further comprising:
one or more air quality sensors located within the communications box.

13. The display assembly of claim 1 further comprising:
a framework subassembly forming a cuboid shape and, at least in part, the front panel and the rear panel of the communications box, wherein the mounting structure interconnects the framework subassembly and each of the one or more electronic display subassemblies.

14. The display assembly of claim 1 wherein:
each of the one or more electronic display subassemblies comprises a cover layer, a layer of liquid crystals, and a number of light emitting diodes.

15. The display assembly of claim 1 wherein:
the mounting structure is configured for mounting to a ground surface.

16. A communications box for a display assembly comprising:
an upper panel forming, at least in part, an upper face of the communications box;
a bottom panel forming, at least in part, a bottom face of the communications box opposing the upper face;
a first side panel forming, at least in part, a first side face of the communications box;
a second side panel forming, at least in part, a second side face of the communications box opposing the first side face;
a front panel movably mounted to the upper panel and forming at least a majority of a front face of the communications box; and
a rear panel movably mounted to the upper panel and forming at least a majority of a rear face of the communications box opposing the front face;
wherein at least one of the front panel and the rear panel comprises a frame with attached fabric which is permeable to ambient air such that the fabric occupies at least a majority of the at least one of the front panel and the rear panel;
wherein said upper face, bottom face, first side face, second side face, front face, and rear panel face define an interior space for electronic equipment;
wherein the front panel, the bottom panel, the first side panel, the second side panel, the rear panel, and the interior space are located above, and spaced apart from, an upper surface of one or more side assemblies of the display assembly when the communications box is mounted to the display assembly.

17. The communications box of claim 16:
further comprising a mounting platform for mounting the communications box to a mounting structure of the display assembly at an elevated, spaced apart position; and/or
wherein said first side panel and said second side panel extend below the bottom face of the communications box for mounting the communications box to the mounting structure of the display assembly at the elevated, spaced apart position.

18. The communications box of claim 17 further comprising:
one or more fans for moving the ambient air through the fabric when activated; and
said electronic equipment, wherein said electronic equipment comprises wireless communications equipment and air quality sensors.

19. The communications box of claim 18 further comprising:
one or more apertures in an upper portion of the communications box fluidly connecting the interior space with an ambient environment.

20. A method for cooling a communications box of a display assembly comprising:
activating one or more fans at the communications box to move ambient air through fabric attached to a framework subassembly, the framework subassembly defining, at least in part, an interior space of the communications box for electronic equipment, wherein said fabric occupies at least a majority of at least one of: a front side and a rear side of the communications box, and wherein the communications box, including at least the framework subassembly and the interior space, is positioned above, and spaced apart from, one or more electronic display subassemblies forming part of the display assembly by way of a mounting platform connecting the framework subassembly to a mounting structure of the display assembly to which said one or more electronic display subassemblies are attached.

* * * * *